(12) United States Patent
Fujihira et al.

(10) Patent No.: US 6,943,410 B2
(45) Date of Patent: Sep. 13, 2005

(54) HIGH POWER VERTICAL SEMICONDUCTOR DEVICE

(75) Inventors: Tatsuhiko Fujihira, Nagano (JP); Takashi Kobayashi, Nagano (JP); Hitoshi Abe, Nagano (JP); Yasushi Niimura, Nagano (JP); Masanori Inoue, Nagano (JP)

(73) Assignee: Fuji Electric Holdings Co., Ltd., Tokyo (JP)

( * ) Notice: Subject to any disclaimer, the term of this patent is extended or adjusted under 35 U.S.C. 154(b) by 0 days.

(21) Appl. No.: 10/170,216

(22) Filed: Jun. 12, 2002

(65) Prior Publication Data

US 2003/0042549 A1 Mar. 6, 2003

(30) Foreign Application Priority Data

Jun. 12, 2001 (JP) ........................................ 2001-176499

(51) Int. Cl.[7] .......................... H01L 29/76; H01L 29/94; H01L 31/062; H01L 23/58
(52) U.S. Cl. ........................ 257/339; 257/341; 257/342; 257/490; 257/494; 257/495
(58) Field of Search ............................... 257/328, 339, 257/341, 342, 490, 494, 495

(56) References Cited

U.S. PATENT DOCUMENTS

| | | | |
|---|---|---|---|
| 4,399,449 A | 8/1983 | Herman et al. | 357/53 |
| 4,412,242 A | 10/1983 | Herman et al. | 357/52 |
| 4,573,066 A | * 2/1986 | Whight | 257/495 |
| 4,593,302 A | 6/1986 | Lidow et al. | 357/23.4 |
| 4,602,266 A | 7/1986 | Coe | |
| 4,974,059 A | * 11/1990 | Kinzer | 257/342 |
| 5,028,548 A | 7/1991 | Nguyen | |
| 5,345,101 A | 9/1994 | Tu | |
| 5,510,634 A | 4/1996 | Okabe et al. | |
| 5,723,890 A | * 3/1998 | Fujihira et al. | 257/339 |
| 5,777,373 A | * 7/1998 | Groenig | 257/495 |

FOREIGN PATENT DOCUMENTS

| | | |
|---|---|---|
| EP | 0 115 093 | 11/1983 |
| EP | 0 671 769 A3 | 3/1995 |
| GB | 1427014 | 4/1973 |
| GB | 2 161 649 A | 5/1985 |
| JP | A63-310395 | 12/1988 |
| JP | A02-246561 | 9/1990 |

OTHER PUBLICATIONS

"Semiconductor devices—Physics and Technology" by S. M. Sze, p. 38, Fig. 7.*

"Optimization and Surface Charge Sensitivity of High–Voltage Blocking Structures with Shallow Junctions"; Hamza Yilmaz; IEEE Transactions on Electron Devices, vol. 38, No. 7; Jul. 1991; pp. 1666–1675.

"A Parametric Study of Power Mosfets"; Chenming Hu; Proc. Conf. Rec. Power Electronics Specialists; IEEE, 1979; pp. 385–395.

* cited by examiner

*Primary Examiner*—Steven Loke
(74) *Attorney, Agent, or Firm*—Rossi, Kimms & McDowel

(57) ABSTRACT

A vertical MOS semiconductor device exhibits a high breakdown voltage and low on-resistance, reduces the tradeoff relation between the on-resistance and the breakdown voltage, and realizes high speed switching. The semiconductor device has a breakdown-voltage sustaining layer, such as an n⁻-type drift layer, and a well region, such as a p-type well region, in the breakdown-voltage sustaining layer. The resistivity ρ (Ωcm) of the breakdown-voltage layer is within a range expressed in terms of the breakdown voltage Vbr (V). The semiconductor device also has stripe shaped surface drain regions that extend from the well region and are surrounded by the well region. The surface area ratio between surface drain regions and the well region, which includes the source region, is from 0.01 to 0.2.

54 Claims, 28 Drawing Sheets

HIGH POWER VERTICAL SEMICONDUCTOR DEVICE

BACKGROUND

The present invention relates to semiconductor devices, such as MOS-type field effect transistors (hereinafter referred to as "MOSFETs") and insulated-gate bipolar transistors (hereinafter referred to as "IGBTs"), that have a gate structure formed of a metal (M), an oxide film (O), and a semiconductor layer (S). Specifically, the present invention relates to vertical semiconductor devices that exhibit a high breakdown voltage and low loss, include electrodes on the major surfaces of a semiconductor chip, and having current flow vertically between the electrodes.

Vertical semiconductor devices typically have current flow between the electrodes on the major surfaces of a semiconductor chip and are used widely as power semiconductor devices. FIG. 31 is a cross-sectional view of the active region of a conventional planar-type n-channel vertical MOSFET, which have main current flow in a vertical direction. The conventional vertical MOSFET shown in FIG. 31 includes a metal drain electrode 20, an n$^+$-type drain layer 11 having a low electrical resistance in electrical contact with the drain electrode 20, an n$^-$-type drift layer 12 working as a layer for sustaining a voltage on the n$^+$-type drain layer 11, p-type well regions 13 formed selectively in the surface portion of the n$^-$-type drift layer 12, and an n$^+$-type source region 15 formed selectively in the surface portion of p-type well regions 13.

A gate electrode 18 is above the extended portion of the p-type well region 13, which extends between the n$^+$-type source regions 15, and the extended portion 14 of the drift layer 12, which extends between the p-type well regions 13, with a gate insulation film 17 interposed therebetween. Hereinafter, the extended portion 14 of the drift layer 12 will be referred to as the "surface drain region" or as the "n$^-$-type surface region." A source electrode 19 is in contact commonly with the n$^+$-type source regions 15 and the p-type well regions 13. A p$^+$-type contact region 21 is formed in the surface portion of the p-type well region 13. The p$^+$-type contact region 21 is in contact with the source electrode 19 to reduce the contact resistance between the p-type well region 13 and the source electrode 19, or to improve the latch-up withstanding capability.

Although it is possible to express the on-resistance in the ON-state of the vertical MOSFET by the total resistance of the current path inside the device, the resistance of the very resistive n$^-$-type drift layer 12 occupies the most part of the total resistance of the semiconductor device, exhibiting a high breakdown voltage. For reducing the losses of the MOSFET, it is effective to reduce the specific resistance or thickness of the n$^-$-type drift layer 12. However, since the n$^-$-type drift layer 12 is depleted in the OFF-state of the device such that the n$^-$-type drift layer 12 sustains the voltage, heavily doping or thinning the n$^-$-type drift layer 12 to reduce the specific resistance thereof undesirably reduces the breakdown voltage. On the other hand, thickening the n$^-$-type drift layer 12 to obtain a semiconductor device with a high breakdown voltage inevitably causes high on-resistance and high losses. In short, there exists a tradeoff relation between the on-resistance and the breakdown voltage. It is well known that the tradeoff relation between the on-resistance and the breakdown voltage exists not only in the MOSFETs but also in the other power semiconductor devices such as IGBTs, bipolar transistors and diodes, although their degree is different from device to device.

Since the p-type well regions 13 are formed in the conventional semiconductor devices described above usually by introducing impurity ions through the gate electrode layer 18, which is used as a mask, the planar pattern of the p-type well regions 13 is an inversion of the planar pattern of the gate electrode layer 18. FIG. 32 is a top plan view showing a planar arrangement pattern of the gate electrode of the conventional n-channel vertical MOSFET. FIG. 33 is a top plan view showing another planar arrangement pattern of the gate electrode of the conventional n-channel vertical MOSFET.

Referring now to FIG. 32, the gate electrode 18 has square windows, as disclosed for example in Japanese Examined Patent Application H07 (1995)-83123. The p-type well regions 13 are square since the p-type well regions 13 are formed by introducing impurity ions through the square windows of gate electrode 18. The n$^+$-type source region is shaped with a square ring since the n$^+$-type source region is formed by introducing impurity ions through the window of the gate electrode 18 used for defining the sides of the n$^+$-type source region. In FIG. 32, the contact regions 24 of the source electrode, formed in contact with the p-type well regions 13 and the n$^+$-type source regions, are shown in the windows of the gate electrode. The contact region 24 has a square shape similar to that of the p-type well region 13.

Referring now to FIG. 33, the gate electrode 18 has hexagonal windows, as disclosed for example in U.S. Pat. No. 4,593,302. In this case, the p-type well regions 13 are hexagonal and the contact region 24 of the source electrode has a hexagonal shape similar to that of the p-type well region 13.

The MOS semiconductor devices also include a breakdown withstanding structure formed usually around the active region thereof to sustain the breakdown voltage of the devices. A guard ring structure, a field plate structure, or a combination of a resistive film and a field plate structure is employed for the breakdown withstanding structure.

However, the breakdown withstanding structures described above have realized 90% or less of the ideal breakdown voltage calculated from the semiconductor substrate used and the breakdown withstanding structure employed. For realizing the target breakdown voltage, it is desirable to use a semiconductor substrate having a high resistivity, a thick semiconductor substrate, or to employ a breakdown withstanding structure having sufficient leeway. Using such a structure, however, inevitably introduces high on-resistance even when the semiconductor devices require low on-resistance.

High on-resistance is inevitable due to the high resistivity in the main portion of the semiconductor substrate or to the thick semiconductor substrates employed. The resistivity ρ (Ωcm) of the main portion of the n-type drift layer 12 below the p-type well region 13 in the crystals used conventionally is expressed in terms of the breakdown voltage Vbr (V) of the MOSFET as follows:

$$-8.89+0.0526 \text{ Vbr} < \rho < -11.86+0.0702 \text{ Vbr}.$$

Only 90% or less of the ideal breakdown voltage calculated based on the structure of the semiconductor device is obtained because of 1) the planar arrangement of the active region and 2) the unoptimized breakdown withstanding structure, which breaks down in advance of the active region.

First, the problem of the conventional active region is described. When the shape of the p-type well region 13 is that shown in FIG. 32 or 33, the shape of each p-type well region 13 is defined by the surrounding n⁻-type surface regions 14 of the n⁻-type drift layer 12. In other words, the p-type well regions 13 are convex with respect to the n⁻-type surface regions 14. Due to the convex shape of the p-type well regions 13, the electric field strength across the pn-junction between the p-type well region 13 and the n⁻-type surface regions 14 is high. Due to the high electric field strength, the breakdown voltage in the pn-junction region is lower than the breakdown voltage determined by the impurity concentrations in the n⁻-type drift layer 12 and the p-type well region 13.

To avoid the problem described above, it has been necessary to dope the n⁻-type drift layer 12 lightly. The lightly doped n⁻-type drift layer 12, however, causes high on-resistance. To prevent the low breakdown voltage caused by the shape effect of the p-type well regions 13, U.S. Pat. No. 5,723,890 discloses a gate electrode, having its main portion formed of a plurality of stripes extending in one direction.

FIG. 34 is a top plan view showing the planar arrangement pattern of the gate electrode 18 disclosed in U.S. Pat. No. 5,723,890. In FIG. 34, the main portion of the p-type well region 13 is stripe shaped. The contact region 24 is also stripe shaped. However, the MOSFET having such striped gate electrode 18 is not completely free of the above noted problems.

The resistance of the gate electrode having square widows or hexagonal windows is suppressed at a low value since the control signal flows through the gate electrode, which works like a network due its shape. The resistance of the gate electrode formed of a plurality of stripes is still sufficiently high as to cause the switching loss increase, which is described later, since the control signal flows only in one direction from the ends of the stripes.

To reduce the losses of the MOSFET, it is desirable to reduce the switching loss, as well as to reduce the loss caused by the on-resistance in the ON-state of the device. Generally describing, to reduce the switching loss, it is important to shorten the switching time in which the device turns from the ON-state to the OFF-state. To shorten the switching time of the vertical MOSFET shown in FIG. 31, it is desirable to reduce the capacitance Crss between the n⁻-type surface region 14 and the gate electrode 18 facing the n⁻-type surface region 14 across the gate insulation film 17. To reduce the capacitance Crss, it is effective to narrow the width of the n⁻-type surface region 14 between the p-type well regions 13. Narrowing the width of the n⁻-type surface region 14, between the p-type well regions 13, however, increases the high resistance due to the effect of the junction-type field-effect transistor (hereinafter referred to as "JFET resistance"), which is one of the on-resistance components of the MOSFETs. The high JFET resistance increases the high on-resistance.

U.S. Pat. No. 4,593,302 discloses a counter doping method, which obviates the problem of high JFET resistance. Although the counter doping technique can suppress the JFET resistance increase, widening the width of the n⁻-type surface region 14, to reduce the JFET resistance, lowers the breakdown voltage. To avoid the breakdown voltage lowering, it is desirable to reduce the amount of the counter doped impurity. The reduced amount of the counter doped impurity is less effective to prevent the JFET resistance from increasing. Thus, all of the conventional techniques that solve one problem, fails to solve another problem, or initiates another problem.

To reduce the switching loss, it is effective to reduce the gate driving charge quantity Qg, as well as to reduce the capacitance Crss. The gate driving charge quantity Qg is calculated by the following expression (1), which calculates the charge quantity, charged to the input capacitance Ciss of the MOS-type semiconductor device from 0 V to the driving voltage $V_1$ (V) of the voltage between the gate and the source Vgs:

$$Qg = \int_0^{V_1} Ciss \times Vgs \, dC/dV \qquad (1)$$

The expression (1) indicates that the reduction of the input capacitance Ciss results in reduction of the gate driving charge quantity Qg.

The input capacitance Ciss of the MOS-type device is expressed by the following expression (2), including the capacitance between the terminals:

$$Ciss = Cgs + Cgd \qquad (2)$$

Here, Cgs is the capacitance between the gate and the source, and Cgd is the capacitance between the gate and the drain (that is Crss).

In addition to the foregoing JFET resistance reduction that employs counter doping, there is another conventional way of reducing the capacitance Crss. FIG. 35 is a cross sectional view of another conventional n-channel vertical MOSFET, which reduces the capacitance Crss. Referring now to FIG. 35, the n-channel vertical MOSFET includes a thick gate insulation film 25 disposed on a part of the gate insulation film 17 facing the n⁻-type surface region 14 to reduce the capacitance Crss. Since steps are formed between gate insulation film 17 and the thick gate insulation films 25, however, the electric field strength in the step portions is high. The high electric field strength decreases the breakdown voltage.

Although narrowing the area of gate electrode 18 may be effective to reduce the capacitance Cgs between the gate and the drain, narrowing the width of the stripe-shaped gate electrode, for example, shown in FIG. 34, increases the gate resistance inside the device, increasing the switching loss.

Regarding the breakdown withstanding structure, since the pn-junction between the p-type well region 13 and the n⁻-type drift layer 12 has a curvature in the outermost peripheral portion of the p-type well region 13 at the same potential as that of the source electrode 19 on the n⁻-type drift layer 12, which acts as a breakdown-voltage sustaining layer, the electric field strength in the curved pn-junction rises more quickly than the electric field strength in the straight pn-junction. The electric field strength in the curved pn-junction reaches the critical electric field strength at a voltage lower than the breakdown voltage calculated from the structure of the breakdown-voltage sustaining layer, causing a breakdown.

In view of the foregoing, there is a need for a semiconductor device that exhibits a high breakdown voltage and greatly reduces the tradeoff relation between the on-resistance and the breakdown voltage, and reduces both the on-resistance and the switching loss.

SUMMARY OF THE INVENTION

The present invention relates to a semiconductor device having a semiconductor chip, a low electrical resistance layer, a breakdown-voltage sustaining layer, and a well region. The low electrical resistance layer can be of a first or second conductivity type formed on a bottom portion of the semiconductor chip. The breakdown-voltage sustaining layer can be of the first conductivity type, formed above the low electrical resistance layer. The well region can be of the second conductivity type, formed in a surface portion of the breakdown-voltage sustaining layer.

The breakdown-voltage sustaining layer can comprise a semiconductor region of the first conductivity type or semiconductor regions of the first conductivity type and semiconductor regions of the second conductivity type arranged alternately.

The semiconductor device can further include a source region, a gate electrode, and a surface drain region. The source region can be of the first conductivity type formed in a surface portion of the well region. The source region can be spaced apart from the breakdown-voltage sustaining layer by the well region. The gate electrode can be formed above a portion extending from the well region and adjoining the source region, with a gate insulation film interposed therebetween. The surface drain regions can be of the first conductivity type and surrounded by the well region in the surface of the semiconductor chip.

According to the present invention, the resistivity $\rho$ ($\Omega$cm) of a main portion of the breakdown-voltage sustaining layer below the well region can be set within a range expressed by $-5.43+0.0316$ Vbr$<\rho<-8.60+0.0509$ Vbr or $-5.43+0.0316$ Vbr$<\rho<-7.71+0.0456$ Vbr, where Vbr (V) represents the breakdown voltage.

Another aspect of the present invention is that the thickness t ($\mu$m) of the portion of the breakdown-voltage sustaining layer between the well region and the low electrical resistance layer can be set within a range expressed by $1.26+0.0589$ Vbr$<t<1.96+0.0916$ Vbr.

Another aspect of the present invention is that the ratio between the total surface area of the surface drain regions surrounded by the well region and the surface area of the well region, including the source region, can be from 0.01 to 0.2.

Another aspect of the present invention is that the surface drain regions in the surface of the semiconductor chip can be stripe shaped. The main portion of the stripe of the surface drain region can be from 0.1 to 2 $\mu$m in width. Moreover, the length of the stripe of the surface drain region can be 100 $\mu$m or longer. More specifically, the length of the stripe of the surface drain region can be 500 $\mu$m or longer. The stripe of the surface drain region can also include a plurality of convex portion extending from the stripe in the direction different from the lengthwise direction of the stripe of the surface drain region.

Another aspect of the present invention is that the gate electrode can comprise a plurality of stripes extending parallel with each other. The well region can surround the stripes of the gate electrode. Moreover, each of the stripes of the gate electrode can cover one or more surface drain regions. The main portion of each of the stripes of the gate electrode can be from 4 to 8 $\mu$m in width. Moreover, the length of the stripes of the gate electrode can be 100 $\mu$m or longer. The gate electrode can include narrow bridges connecting the stripes thereof.

Another aspect of the present invention is that the resistivity in portions of the surface drain regions shallower than the well region is lower than the resistivity in the main portion of the breakdown-voltage sustaining layer below the well region.

Another aspect of the present invention is that the semiconductor device can include guard rings, which are of the second conductivity type in the surface portion of the semiconductor chip, surroundings the well region. The number of the guard rings can be equal to or more than the number n expressed by $n=1.0\times$Vbr/100, $n=1.5\times$Vbr/100, or $n=6.0\times$Vbr/100. Moreover, the spacing between the well region and a first of the guard rings, which is nearest to the well region, can be 1 $\mu$m or less, more specifically, 0.5 $\mu$m or less. Moreover, the first guard ring can be in contact with the well region. Moreover, the spacing between the first guard ring and a second of the guard rings, which is second nearest to the well region, can be 1.5 $\mu$m or less. Moreover, the spacing between the well region and the first guard ring can be $d_1/4$ or less, more specifically, $d_1/8$ or less, $d_1$ being shallower one of the junction depth of the well region and the junction depth of the guard rings. Moreover, the spacing between the first guard ring and the second guard ring can be is $d_2/4$ or less, where $d_2$ is the junction depth of the guard rings. Moreover, the difference $I_2-I_1$ between the spacing $I_2$ between the first guard ring and the second guard ring, and the spacing $I_1$ between the well region and the first guard ring is 1 $\mu$m or less. Moreover, the number of the guard rings can be 5 or more, and the width of the first guard ring can be wider than the width of the fifth guard ring, which is fifth nearest to the well region.

Another aspect of the present invention is that the semiconductor device can include an electrical conductor film above the surface of the breakdown-voltage sustaining layer between the well region and the first guard ring, with an insulation film interposed between the electrical conductor film and the surface of the breakdown-voltage sustaining layer.

The semiconductor device can further include an organic polymer film protecting the surface of the semiconductor device.

The breakdown voltage Vbr of the semiconductor device can be higher than 100 V and lower than 5000 V.

DETAILED DESCRIPTION

Now the present invention will be explained hereinafter with reference to the accompanied drawing figures that illustrate the preferred embodiments of the invention.

Figure 2:
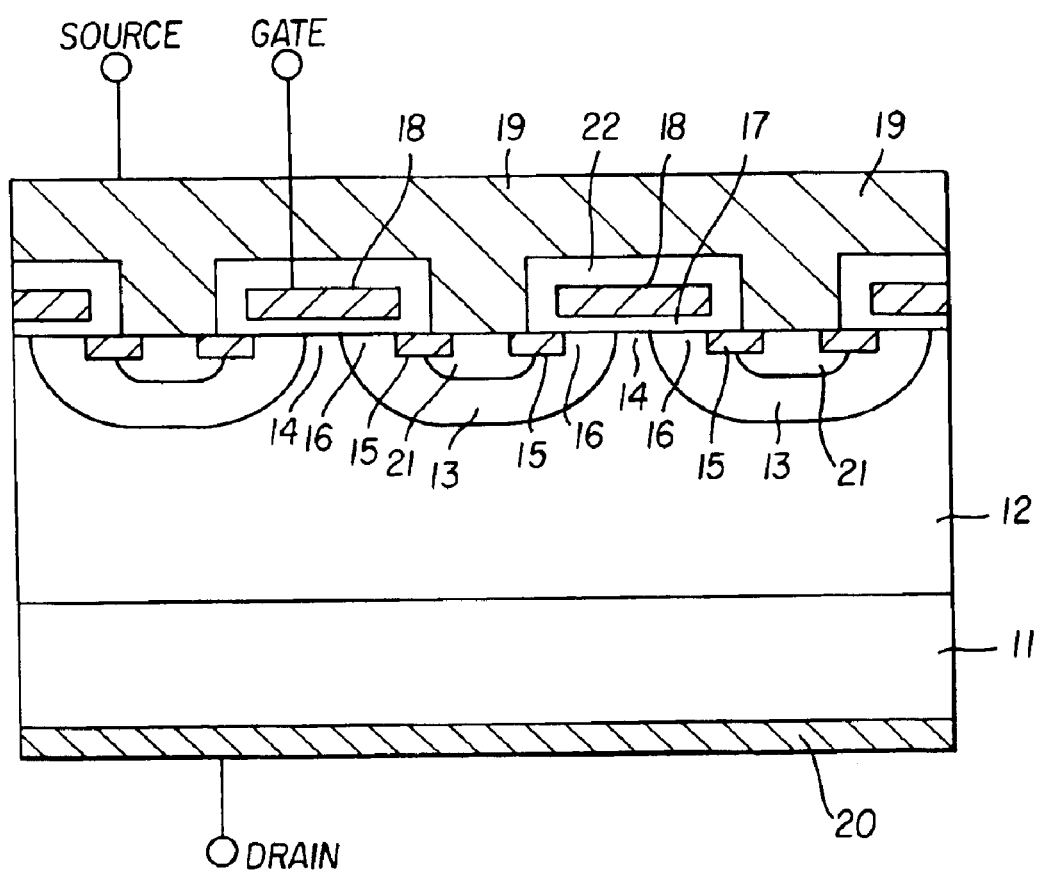
FIG. 2 is a cross-sectional view showing a part of the active region of the n-channel vertical MOSFET according to the first embodiment.

FIG. 2 is a cross-sectional view showing a part of the active region of an n-channel vertical MOSFET, in which the main current flows vertically (relative to the drawing) according to a first embodiment of the invention. A breakdown withstanding structure, such as a guard ring and a field plate, which is disposed in the peripheral portion of the semiconductor chip of the MOSFET, will be described later. The MOSFET according to the first embodiment includes an $n^+$-type drain layer 11 having a low resistance, an $n^-$-type drift layer 12 having a high specific resistance on the $n^+$-type drain layer 11, a p-type well region 13 formed selectively in the surface portion of the $n^-$-type drift layer 12, and an $n^+$-type source region 15 in the p-type well region 13. A plurality of $n^-$-type surface regions or surface drain regions 14, which are part of the $n^-$-type drift layer 12, extend through the p-type well region 13 to the surface of the semiconductor chip. A heavily doped $p^+$-type contact region 21 is formed in the well region 13 to reduce the contact resistance. A polycrystalline silicon gate electrode 18 is formed above the surface of the p-type well region 13 and the $n^-$-type surface region 14, and extends between the $n^+$-type source region 15, with a gate insulation film 17 interposed therebetween. A source electrode 19 is in common contact with the $n^+$-type source region 15 and the $p^+$-type contact region 21. A source electrode 19 can extend over the gate electrode 18 with an interlayer insulation film 22 interposed therebetween. The interlayer insulating film 22 also can be formed on and around, or surround the gate electrode 18. A drain electrode 20 is formed on the back surface of the $n^+$-type drain layer 11.

Now the working mechanism of the MOSFET of FIG. 2 is described briefly. Depletion layers expand toward the $n^-$-type drift layer 12 from the p-type well region 13, the potential of which is the same as the potential of the source electrode 19, which is usually grounded in the reverse blocking state. This secures a breakdown voltage that is determined by the widths of the depletion layers and the electric field strength in the depletion layers. The expansion of the depletion layers is determined by the thickness and the specific resistance of the $n^-$-type drift layer 12. A high breakdown voltage can be obtained by increasing the specific resistance and the thickness of the $n^-$-type drift layer 12. By biasing the gate electrode 18 at a potential positive with respect to the potential of the source electrode 19, an inversion layer is created in the surface portion 16 of the p-type well region 13. The inversion layer works as a channel, through which electrons flow as carriers from the n$^+$-type source region 15 to the n$^-$-type surface region 14. Then, the electrons flow to the drain electrode 20 via the n$^-$-type drift layer 12 and the n$^+$-type drain layer 11, resulting in the ON-state of the MOSFET.

Figure 31:
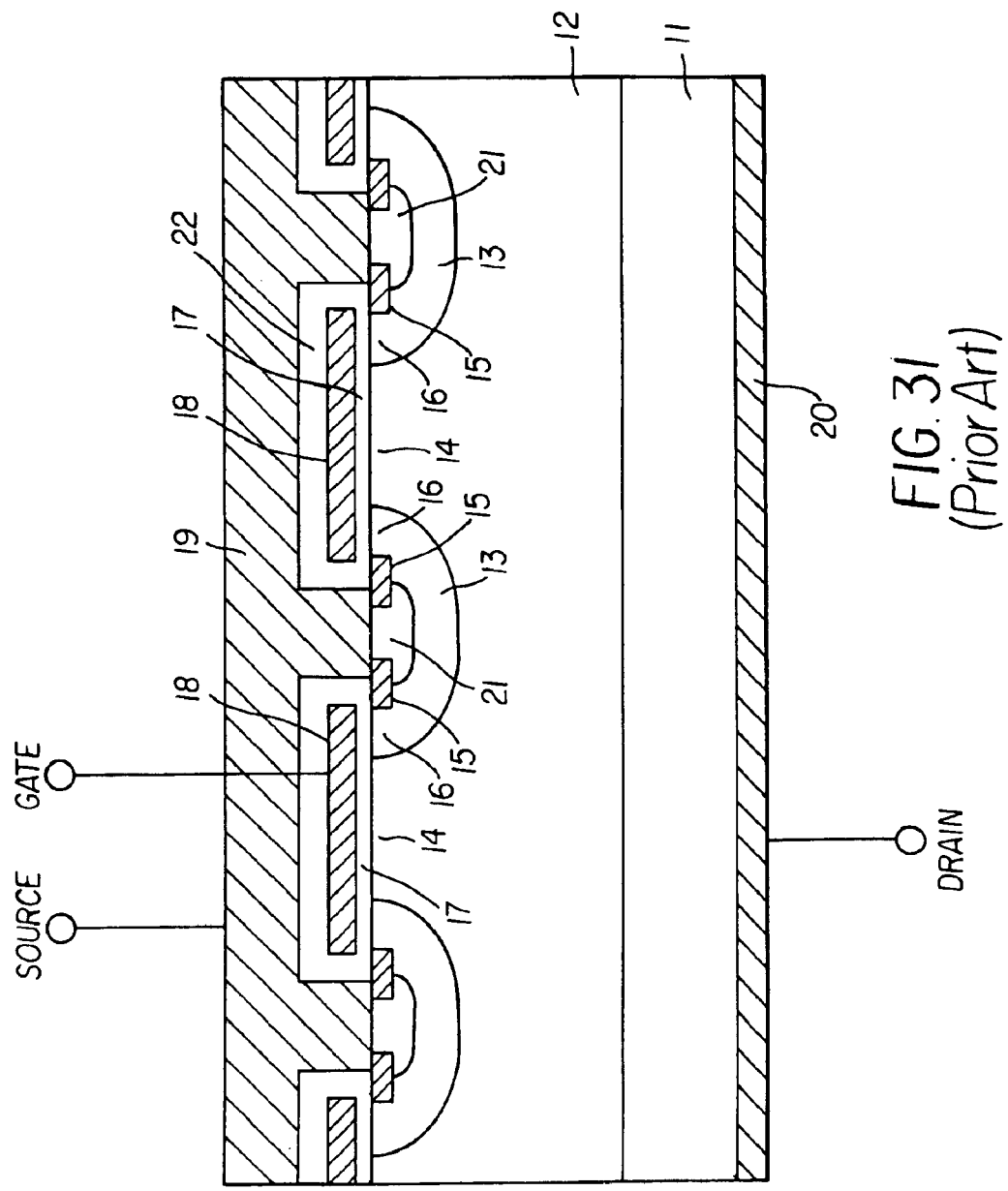
FIG. 31 is a cross sectional view of the active region of a conventional n-channel vertical MOSFET.

Although the cross section shown in FIG. 2 resembles the conventional cross section shown in FIG. 31, the MOSFET according to the first embodiment of the invention is different from the conventional MOSFET shown in FIG. 31 in that the n$^-$-type surface region 14 between the p-type well regions 13 in FIG. 2 is narrower than the n$^-$-type surface region 14 in FIG. 31. Indeed, FIG. 1, which is a top plan view showing the semiconductor chip surface of the n-channel vertical MOSFET according to the first embodiment of the invention, illustrates the specific feature of the MOSFET according to the first embodiment of the invention. Since the breakdown withstanding structure formed usually in the peripheral portion of the semiconductor device is not pertinent to the specific feature of the MOSFET according to the first embodiment, the breakdown withstanding structure is omitted from FIG. 1.

Figure 1:
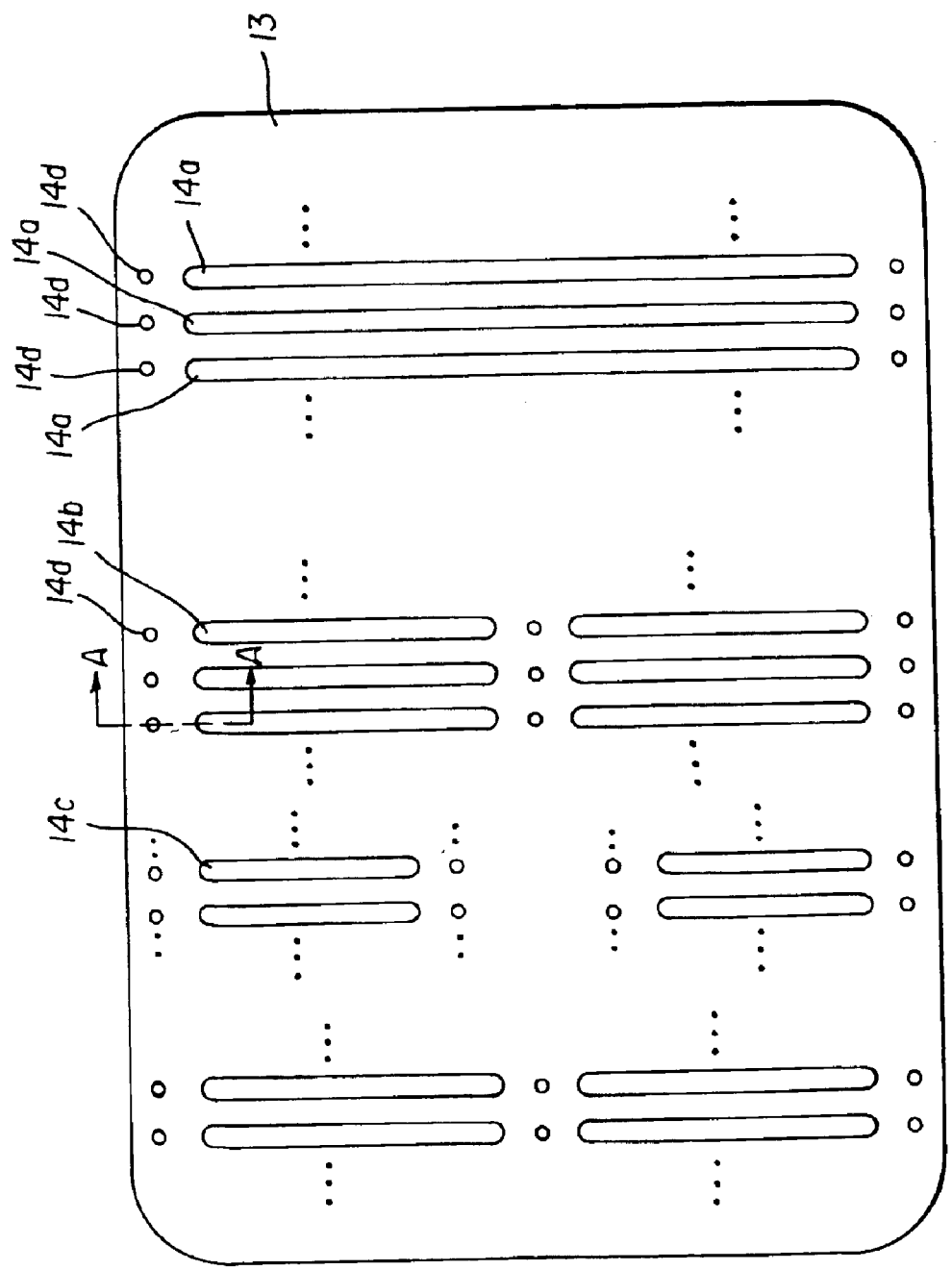
FIG. 1 is a top plan view showing the semiconductor chip surface of an n-channel vertical MOSFET according to a first embodiment of the invention.
Figure 3:
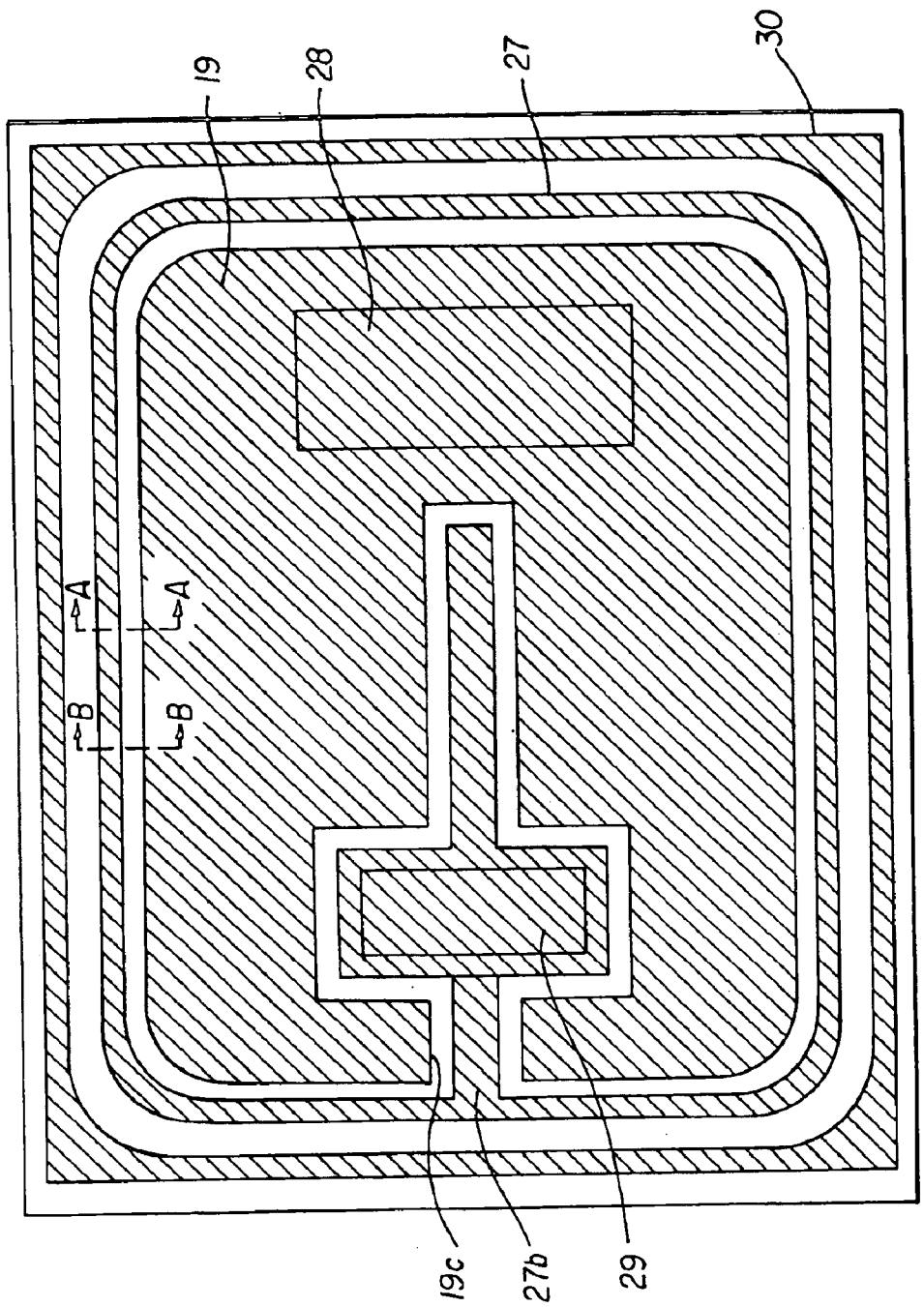
FIG. 3 is a top plan view showing the arrangement of the metal electrodes on the semiconductor chip of the MOSFET according to the first embodiment.

Referring to FIG. 1, the p-type well region 13 surrounds many n$^-$-type surface regions 14, each being striped shaped and extending along one direction. Some n$^-$-type surface regions 14 are not described fully but represented by dots in FIG. 1 to simplify the illustration. FIG. 1 illustrates four kinds of n$^-$-type surface regions 14, their lengths being different from one another, corresponding to the arrangements of the source electrode 19 and the metal gate electrode 27 shown in FIG. 3. Long stripes 14$a$ of the n$^-$-type surface regions are positioned below the wide portion of the source electrode 19, short stripes 14$b$ of the n$^-$-type surface regions are positioned below the portions of the source electrode 19 between where the metal gate electrode 27 extends, and further short stripes 14$c$ of the n$^-$-type surface regions are positioned below the portions of the source electrode 19 between where a gate electrode pad 29 is formed. In FIG. 3, a source pad 28 for connecting the source electrode 19 to the external terminal is formed in the source electrode 19. The metal gate electrode 27 surrounds the source electrode 19. A branch 27$b$ of the metal gate electrode 27 extends into a cutout 19$c$ formed in the source electrode 19. The gate pad 29, which connects the metal gate electrode 27 to the external terminal, is disposed on part of the branch 27$b$ of the metal gate electrode 27 extending into the cutout 19$c$. A peripheral electrode 30 in the outermost circumferential portion of FIG. 3 is set at the potential same as the potential of the drain electrode 20. The peripheral electrode 30 acts as a stopper electrode, which is usually disposed in the outermost circumferential portion of the breakdown withstanding structure to suppress the expansion of the depletion layers.

Figure 4:
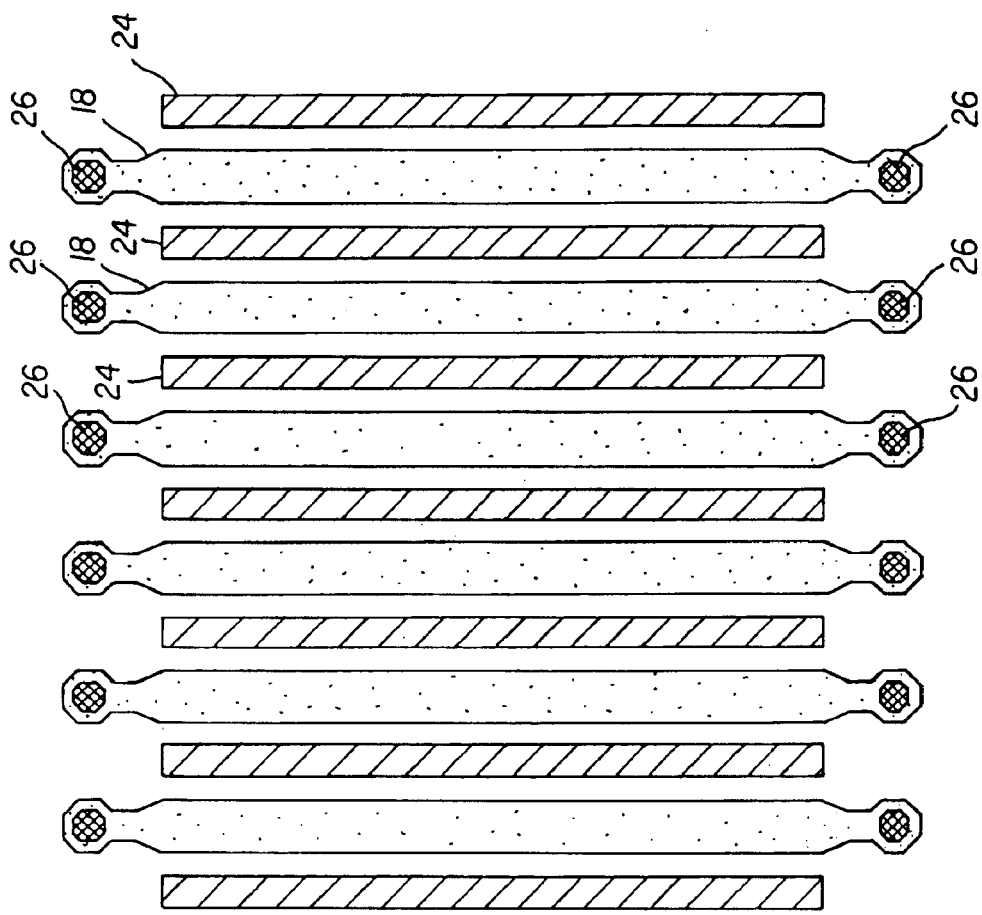
FIG. 4 is a top plan view showing the arrangement of the stripes of the gate electrode and the source electrode on the semiconductor chip of the MOSFET according to the first embodiment.

FIG. 4 is a top plan view showing the shape of the gate electrodes 18 working as a mask for forming each region in the surface portion of the semiconductor chip and the relative positional relationship between the stripes of the gate electrode 18 and the source electrode contact regions 24. FIG. 4 shows the stripes of the gate electrodes 18, each having a certain length, and the stripes of the source electrode contact regions 24, each having a certain length. The stripes of the gate electrode 18 and the stripe-shaped source electrode contact regions 24 are arranged alternately. The end portions of each stripe of the gate electrode 18, which extends in one direction, are narrowed once and widened again. The end portions of each stripe of the gate electrode 18 are narrowed once to minimize the gate electrode area outside the active region and to reduce the capacitance Crss.

Since the p-type well region 13 is formed by introducing the acceptor impurity through the gate electrode 18 acting as a mask, the capacitance Crss between the gate electrode 18 and the n$^-$-type surface regions 14 is reduced by expanding the p-type well region 13, as widely as possible, to the portions of the semiconductor chip below the narrowed portions of the gate electrode stripes such that the area of the n$^-$-type surface regions 14 becomes narrow. The tip portions of each gate electrode 18 are widened again to form bonding sections 26 for bonding each gate electrode 18 with the metal gate electrode. The metal gate electrode 27 shown in FIG. 3 is positioned above the bonding sections 26.

Referring again to FIG. 1, the smallest n$^-$-type surface regions 14$d$ face the end portions of the n$^-$-type surface regions 14$a$, 14$b$, and 14$c$ across the p-type well region 13. The smallest n$^-$-type surface regions 14$d$ are positioned below the bonding sections 26 at the tip portion of the stripes of the gate electrode 18. When the size of the bonding sections 26 is determined based on the precision of the machining technique available at present, the smallest n$^-$-type surface regions 14$d$ are not entirely covered by the p-type well region 13. In other words, the smallest n$^-$-type surface regions 14$d$ remain exposed. When the machining technique is precise enough, the smallest n$^-$-type surface regions 14$d$ are entirely covered entirely by p-type well region 13. Each of the stripes of the gate electrode 18 can cover one or more surface drain regions.

Figure 5:
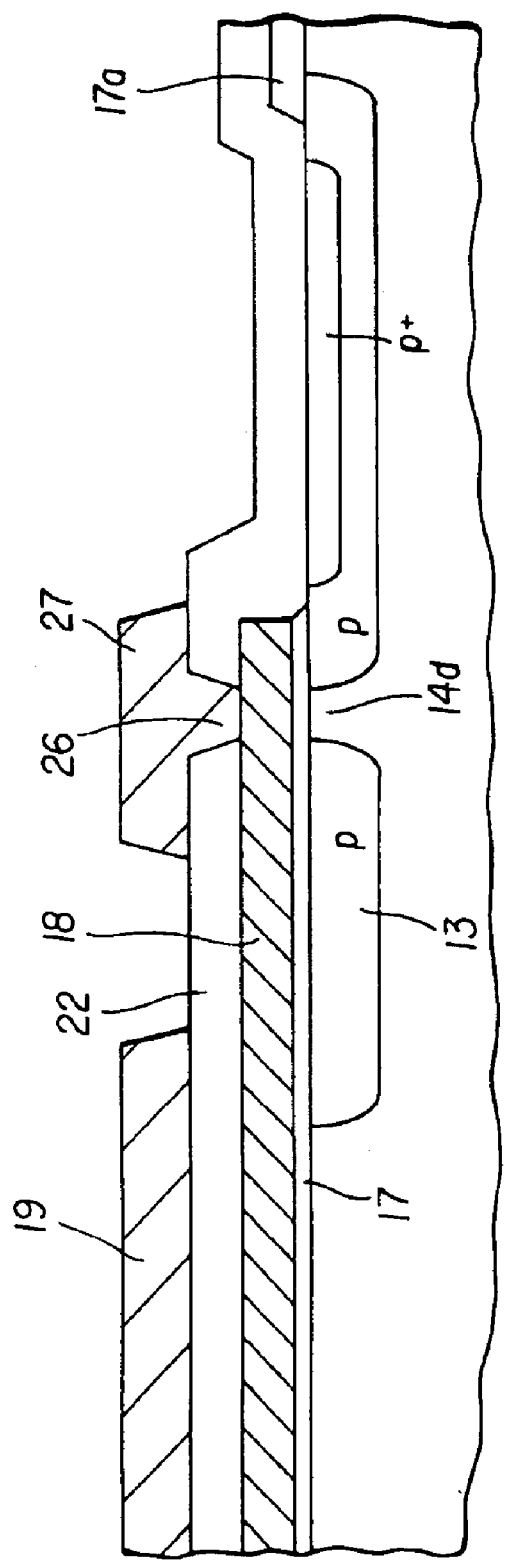
FIG. 5 is a cross section taken along line A—A of FIG. 1 showing the connection of the gate electrode and the metal gate electrode in the bonding section.

FIG. 5 is a cross section taken along line A—A of FIG. 1 showing the connection of the gate electrode 18 and the metal gate electrode 27 in the bonding section 26. In the figure, a gate oxide film 17, a thick field oxide film 17$a$, and a source electrode 19 are shown. The portion on the surface electrode taken along line A—A corresponds to the section taken along line A—A of FIG. 3. The dimensions of the constituent layer and regions of the MOSFET according to the first embodiment of the invention are described below.

Figure 32:
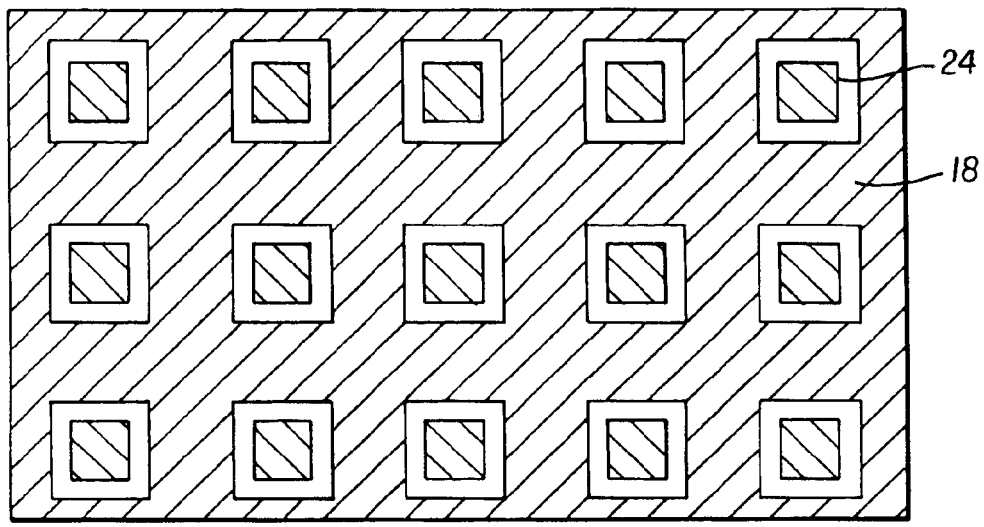
FIG. 32 is a top plan view showing a planar arrangement pattern of the gate electrode in the conventional n-channel vertical MOSFET.
Figure 33:
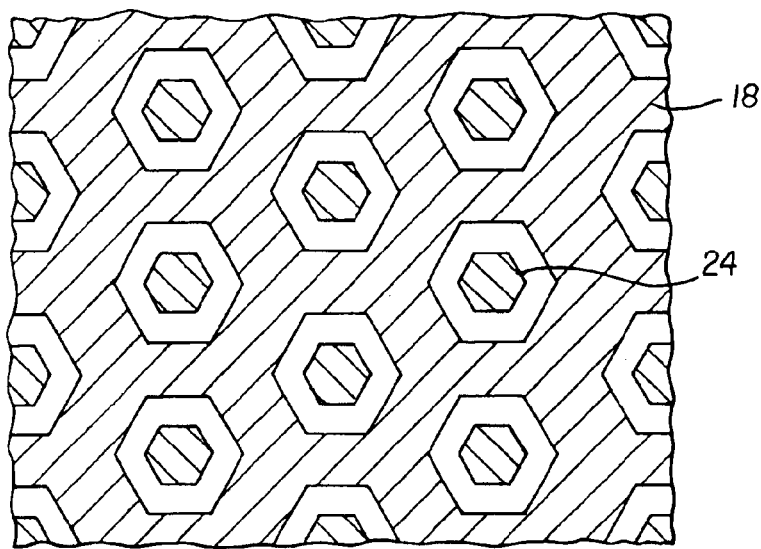
FIG. 33 is a top plan view showing another planar arrangement pattern of the gate electrode in the conventional n-channel vertical MOSFET.
Figure 34:
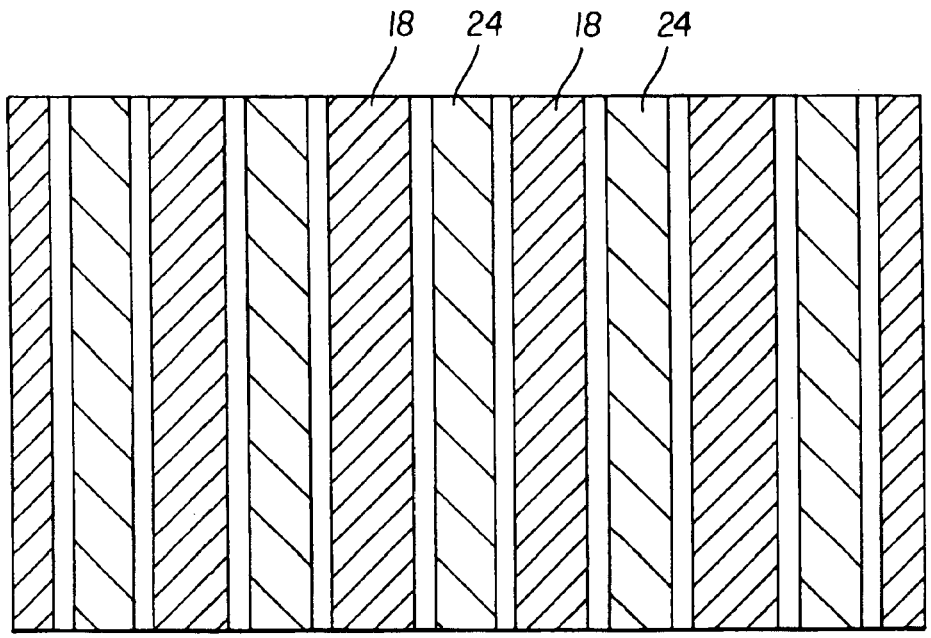
FIG. 34 is a top plan view showing still another planar arrangement pattern of the gate electrode in the conventional n-channel vertical MOSFET.
Figure 35:
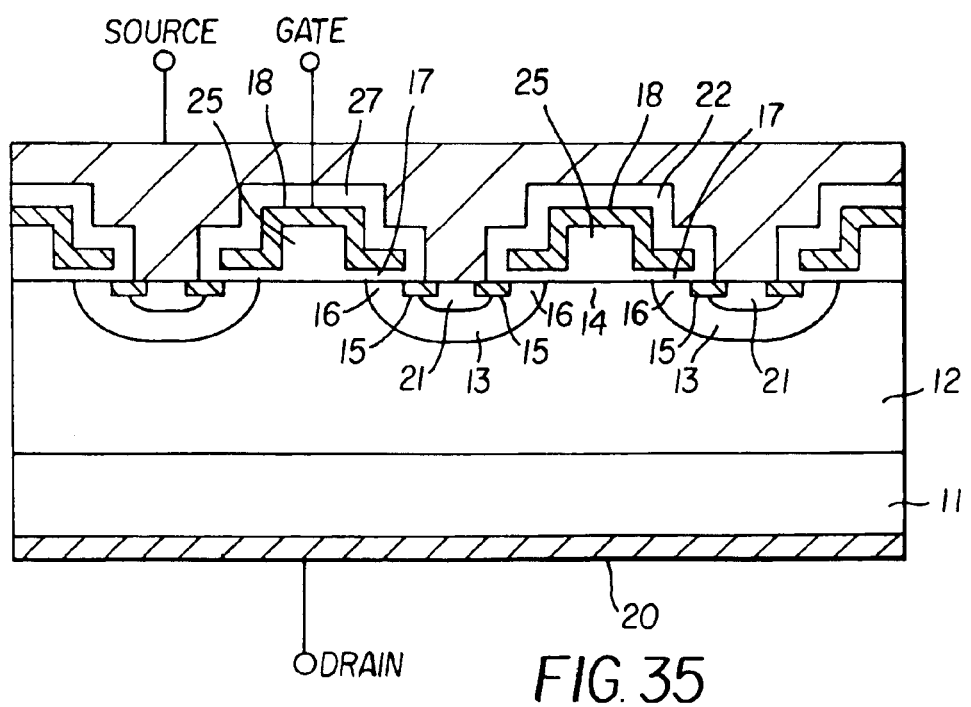
FIG. 35 is a cross sectional view of the active region of another conventional n-channel vertical MOSFET.

In FIG. 4, the stripe of the gate electrode 18 is 5.6 $\mu$m in width and 3.6 mm in length. The stripes of the gate electrode 18 are spaced apart from each other by 9.4 $\mu$m. Thus, the stripes of the gate electrode 18 repeat at a pitch of 15 $\mu$m. Impurity ions for forming the p-type well region 13 are introduced using the array of the gate electrode 18 acting as a mask. Due to this scheme, the n$^-$-type surface region 14 in FIG. 1 is 1.6 $\mu$m in width. The width of the p-type well region 13 between the n$^-$-type surface regions 14 is 13.4 $\mu$m. In FIG. 2, the diffusion depth of the p-type well region 13 is around 4 $\mu$m. The width of the n$^+$-type source region 15 is 2.5 $\mu$m, and the diffusion depth thereof is 0.3 $\mu$m. In FIG. 4, the source electrode contact region 24 is 7 $\mu$m in width. When the dimensions of the constituent elements are set to the dimensions described above, the ratio between the area of the n$^-$-type surface regions 14 and the area of the p-type well region 13 in the surface of the semiconductor chip is 0.12. For comparison, the surface area ratio between the n$^-$-type surface region 14 and the p-type well regions 13 of the conventional MOSFETs described with reference to FIGS. 32, 33, and 34 are about 3, 2, and 1, respectively.

Figure 13:
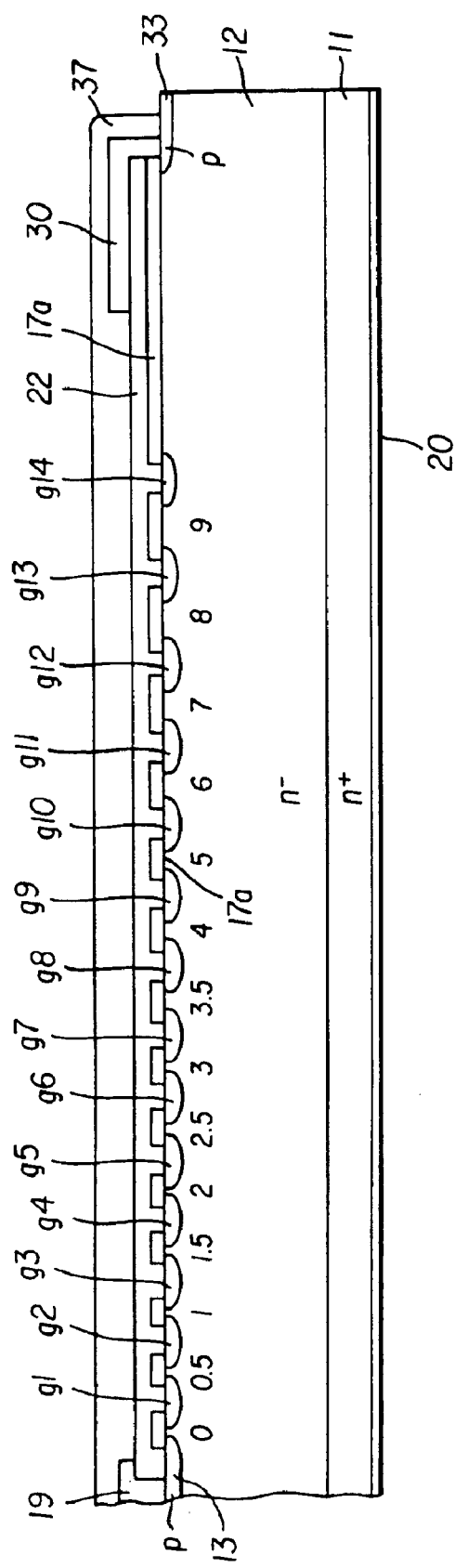
FIG. 13 is a cross sectional view showing the breakdown withstanding structure of the n-channel vertical MOSFET according to the first embodiment of the invention.

FIG. 13 is a cross-sectional view showing the breakdown withstanding structure of the n-channel vertical MOSFET according to the first embodiment of the invention. The active structure is shown on the left hand side of FIG. 13, and the breakdown withstanding structure is shown on the right end of the figure. For example, the breakdown voltage class of the MOSFET shown in FIG. 13 is the 600 V class. A p-type peripheral region 33 is in the end surface portion of the n$^-$-type drift layer 12. A peripheral electrode 30 is on the p-type peripheral region 33. A polyamide film 37 for surface protection is shown in FIG. 13. Guard rings $g_1$ through $g_{14}$ are shown in FIG. 13. In detail, fourteen guard rings $g_1$ through $g_{14}$ are disposed between the source electrode 19 and the peripheral electrode 30 biased at the potential of the drain electrode. The numerals described below the gaps between adjacent guard rings represent the spacings between the adjacent guard rings in the $\mu$m unit. Adjacent guard rings are more widely spaced apart as they are positioned farther from source electrode 19. Note that the gate metal electrode 27 is not illustrated in FIG. 13.

For obtaining the breakdown voltage $BV_{DSS}$ (hereinafter designated by "Vbr") of 600 V, the resistivity of the n⁻-type drift layer 12 can be set, for instance, at 20 Ωcm, and the thickness thereof at set, for instance, at 50 $\mu$m. The resistivity of 20 Ωcm is within the maximum and minimum resistivity defined by the following expression: $-5.43+0.0316$ Vbr$<\rho<-8.60+0.0509$ Vbr. The thickness of 50 $\mu$m is within the maximum and minimum thickness defined by the following expression: $1.26+0.0589$ Vbr$<t<1.96+0.0916$ Vbr.

To surely obtain the breakdown voltage Vbr of 600 V, fourteen guard rings are employed. The number of the guard rings (14) is larger than the number of guard rings, $1.0\times 600/100=6$, calculated from the following expression, which defines the number of guard rings as: $1.0\times$Vbr$/100$.

The spacing between the p-type well region 13 and the first guard ring $g_1$ is 0 $\mu$m. In other words, the p-type well region 13 and the first guard ring $g_1$ are connected to each other. The spacing between the first guard ring $g_1$ and the second guard ring $g_2$ is 0.5 $\mu$m. The spacing between the adjacent guard rings is set such that the spacing becomes wider by 0.5 $\mu$m or by 1 $\mu$m increment as the spacing between p-type well region 13 and the ith guard ring gi becomes wider, for example, 1 $\mu$m, 1.5 $\mu$m, 2 $\mu$m, 2.5 $\mu$m, 3 $\mu$m, 3.5 $\mu$m, 4 $\mu$m, 5 $\mu$m, 6 $\mu$m, 7 $\mu$m, 8 $\mu$m, and 9 $\mu$m. The width of the ith guard ring gi is set from the first guard ring to the fourteenth guard ring such that the width becomes narrower as the spacing between the p-type well region 13 and the ith guard ring gi becomes wider, for example, 14.5 $\mu$m, 14.5 $\mu$m, 13.5 $\mu$m, 13.5 $\mu$m, 13.5 $\mu$m, 12.5 $\mu$m, 12.5 $\mu$m, 11.5 $\mu$m, 11.5 $\mu$m, 10.5 $\mu$m, 10.5 $\mu$m, 10.5 $\mu$m, 10.5 $\mu$m, and 10.5 $\mu$m. The guard rings are 4 $\mu$m in thickness, which is the same as the thickness of the p-type well region 13.

Usually, depletion layers expand from the pn-junction between the n⁻-type drift layer 12 and the p-type well region 13 at the source potential into the n⁻-type drift layer 12, when the source electrode 19 is biased at the ground potential and a positive bias voltage is applied to drain electrode 20. In the active region, the depletion layers expand downward from the p-type well region 13 in the surface portion of the semiconductor chip into the n⁻-type drift layer 12.

In the breakdown withstanding region, depletion layers expand laterally as well as vertically from the p-type well region 13 into the n⁻-type drift layer 12. Since the guard rings $g_1$ through $g_{14}$ are arranged very closely to the laterally expanding depletion layer, the electric field strength, which may otherwise be intensified by the shape effect due to the curvature of the diffusion layer of the p-type well region 13, is prevented from increasing in the surface portion of the semiconductor chip between the p-type well region 13 and first ring $g_1$. In the same way as described above, the electric field strength is prevented from increasing between adjacent guard rings.

By setting the parameters of the constituent elements as described above, the breakdown voltage of 664 V is obtained. The breakdown voltage of 664 V is 97% of the theoretical breakdown voltage of 684 V calculated for the specific resistance of 20 Ωcm and the thickness of 50 $\mu$m of the n⁻-type drift layer 12. In the conventional breakdown withstanding structure, the curved pn-junction between the p-type well region and the n⁻-type drift layer causes a low breakdown voltage. In contrast, the first guard ring positioned in immediate proximity to the p-type well region according to the first embodiment of the invention facilitates extremely reduction of the electric field strength around the curved section of the p-type well region, since the depletion layer expanding from the p-type well region reaches the first guard ring immediately.

Since the similar relations hold between the first and second guard rings, between the second and third guard rings, and so on, it becomes possible to obtain a high breakdown voltage even when the specific resistance of the n⁻-type drift layer is low.

The technical paper by Hu (Rec. Power Electronics Specialists Conf., San Diego, 1979 (IEEE 1979) p.385) describes that the on-resistance Ron of the unipolar semiconductor device is expressed by the following expression (3):

$$Ron \propto (Vbr)^{2.5} \qquad (3)$$

That is, the on-resistance Ron is proportional to the breakdown voltage Vbr to the 2.5th power. In other words, when the breakdown voltage is improved by 1%, the on-resistance is reduced by 2.5% (since a thinner semiconductor wafer with the same specific resistance can be used). Therefore, when the breakdown voltage is improved by 5%, the on-resistance is reduced by 13%. And, when the breakdown voltage is improved by 7.5%, the on-resistance is reduced by 20%, which is a substantial leap.

The merits of connecting the p-type well region 13 and the first guard ring $g_1$, that is, the effects of setting the spacing between p-type well region 13 and the first guard ring $g_1$, at 0 $\mu$m, will now be described. One may consider setting 0 $\mu$m spacing between the first guard ring $g_1$ and the p-type well region 13 does not exhibit any merit. However, the first guard ring $g_1$ that is connected or superimposed to p-type well region 13 contributes to improving the breakdown voltage as FIG. 15 indicates. The spacing between the first guard ring $g_1$ and p-type well region 13 set at 0 $\mu$m indeed has merits. The spacing between the p-type well region 13 and the first guard ring $g_1$, formed through a mask having windows spaced apart for 0 $\mu$m from each other, is confined within 0.5 $\mu$m, even when over etching of 0.5 $\mu$m or less is caused by the variations of the process parameters. Thus, the variations of the process parameters are compensated to some extent by setting the designed spacing between the first guard ring $g_1$ and the p-type well region 13 at 0 $\mu$m.

Figure 12:
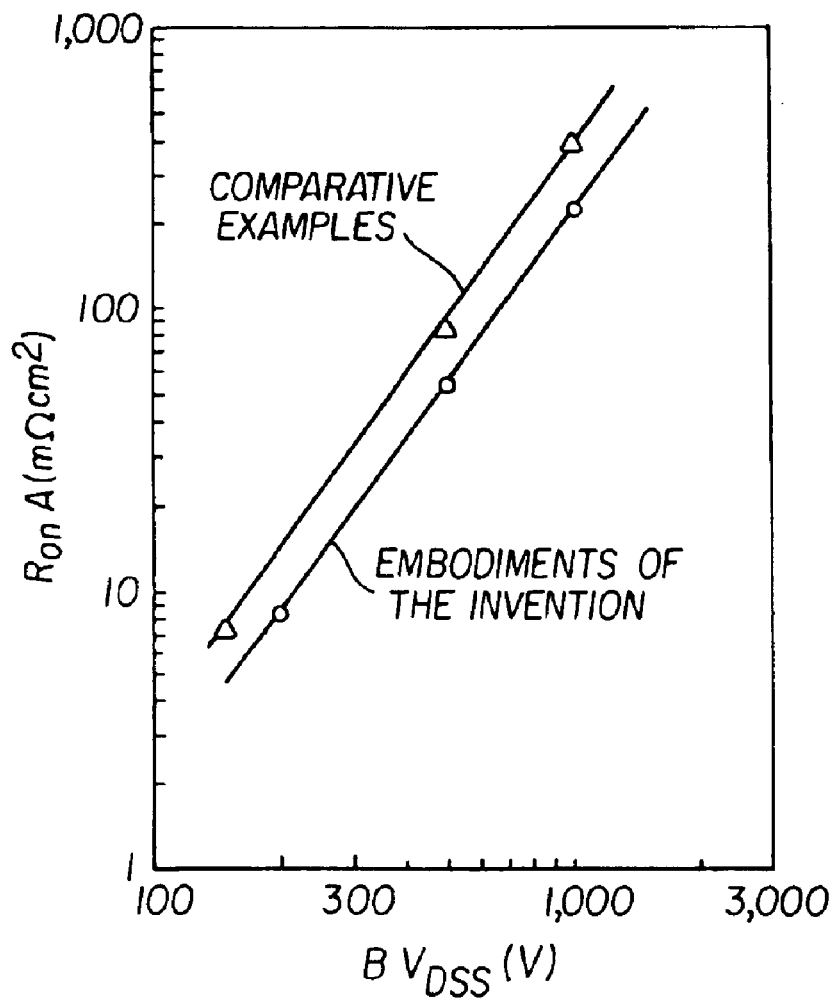
FIG. 12 is a graph relating the breakdown voltage and the on-resistance RonA for the experimental n-channel vertical MOSFETs according to the invention and the comparative n-channel vertical MOSFETs.

MOSFETs of the different breakdown voltage classes according to the first embodiment are fabricated and compared with the conventional MOSFET described earlier with reference to FIG. 34. FIG. 12 is a graph relating the breakdown voltage and the on-resistance RonA for the experimental MOSFETs according to the invention and the comparative MOSFETs, the breakdown voltage classes thereof are different. The horizontal axis of the figure represents the logarithm of the breakdown voltage $BV_{DSS}$ (V), and the vertical axis the logarithm of the on-resistance RonA (mΩcm²). The on-resistance RonA of the experimental MOSFET according to the present invention is half the on-resistance RonA of the conventional MOSFET, indicating the great merit of the MOSFET according to the invention. Although MOSFETs with the breakdown voltage of the 150 V class or lower are not typically fabricated according to the invention, FIG. 12 indicates that the MOSFETs with the breakdown voltage of the 150 V class or lower exhibit the same effect.

The resistivity ρ and the thickness t are varied and the on-resistance of the MOSFETs according to the first embodiment of the invention is compared with the on-resistance of the conventional MOSFET set at 100%. The results are listed in Table 1.

TABLE 1

| t (μm) | ρ (Ωcm) | | | |
|---|---|---|---|---|
| | $-5.34 + 0.0316\, V_{br}$ <ρ< $-8.60 + 0.0509\, V_{br}$ | $-5.34 + 0.0316\, V_{br}$ <ρ< $-7.71 + 0.0456\, V_{br}$ | $-5.34 + 0.0316\, V_{br}$ <ρ< $-6.82 + 0.0404\, V_{br}$ | Conventional |
| $1.26 + 0.0589\, V_{br}$ <t< $1.96 + 0.0916\, V_{br}$ | About 75% | About 67% | About 58% | |
| The 600 V class ($V_{br}$ = 660 V) | 66–105 mΩcm² | 66–95 mΩcm² | 66–84 mΩcm² | 111–148 mΩcm² |
| The 900 V class ($V_{br}$ = 990 V) | 181–291 mΩcm² | 181–261 mΩcm² | 181–231 mΩcm² | 306–407 mΩcm² |
| $1.26 + 0.0589\, V_{br}$ <t< $1.68 + 0.0785\, V_{br}$ | About 63% | About 57% | About 50% | |

For the MOSFET of the 600 V class and the MOSFET of the 900 V class, the on-resistance values thereof are described in Table 1. As the results described in Table 1 clearly indicate, the on-resistance is reduced from 50 to 75% of the on-resistance of the conventional MOSFET by setting the resistivity ρ and the thickness t of the n⁻-type drift layer at the respective appropriate values.

Experimental MOSFETs with the breakdown voltage of the different classes according to the first embodiment are fabricated and the products of the on-resistance and the capacitance between the gate and drain (Ron.Crss) are compared with those of the conventional MOSFETs. Results are listed in Table 2.

TABLE 2

| | Breakdown Voltages (V) | | |
|---|---|---|---|
| | 170 | 660 | 990 |
| MOSFETs according to the First Embodiment | 1.8 ΩpF | 2.95 ΩpF | 15.0 ΩpF |
| Conventional MOSFETs | 8.8 ΩpF | 17.5 ΩpF | 80 ΩpF |

The products Ron.Crss of the MOSFETs according to the first embodiment of the invention are around one fifth the product Ron.Crss of the conventional MOSFET. The loss of the semiconductor switching device is determined by the on-resistance and the switching loss. The switching loss becomes lower with decreasing capacitance Crss. The loss of the device, the product Ron.Crss thereof is low. The MOSFETs according to the invention have the characteristics Ron.Crss that are much lower than those of the conventional MOSFET.

Figure 6:
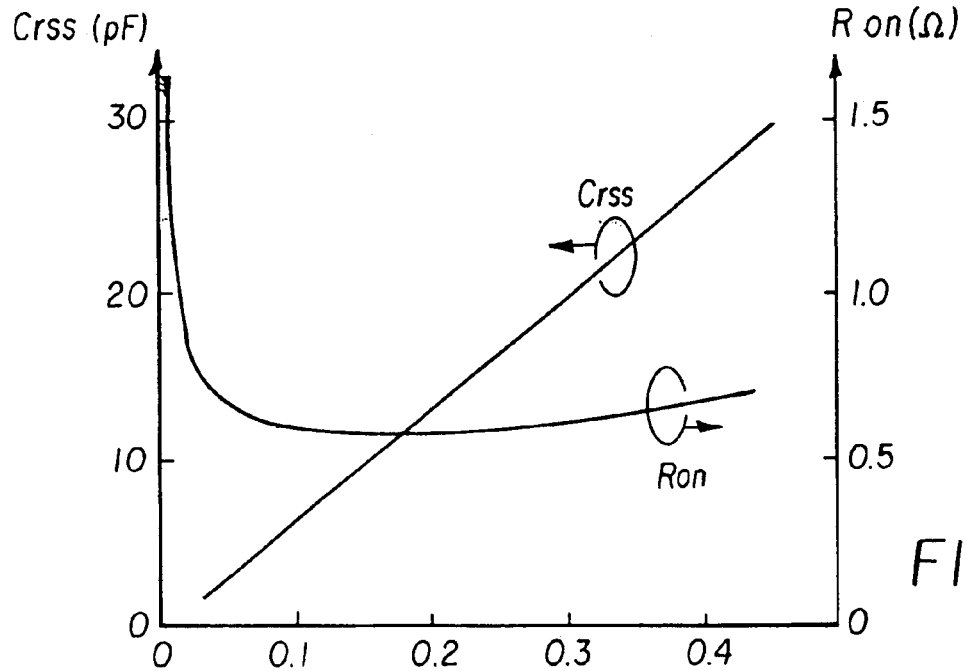
FIG. 6 is a characteristic diagram relating the surface area ratio between the n-type surface drain regions and the well region, the capacitance Crss between the gate and the drain, and the on-resistance Ron of the experimental n-channel vertical MOSFETs with each other.

When the width of the gate electrode 18 is widened, the capacitance Crss increases as shown in FIG. 6, although the on-resistance Ron does not vary so much, resulting in a high switching loss. Although the capacitance Crss is reduced by narrowing the width of the gate electrode 18, the on-resistance Ron increases, resulting in a high steady state loss. In the MOSFETs according to the first embodiment, the length of the gate electrode stripes extending in one direction is around 4 mm, which is almost the same as the chip size of the active region, through which the main current flows. Although having the length of the gate electrode stripes almost the same as the chip size of the active region poses no problem, bonding portions for bonding the gate electrode stripes to the metal gate electrode may be disposed at the spacing of 100 μm or wider, preferably at the spacing of 500 μm or wider, so as not to increase the internal gate resistance.

As the cross section of the MOSFET according to the first embodiment shown in FIG. 2, which is almost the same as the cross section of the conventional MOSFET shown in FIG. 31, the MOSFET according to the first embodiment is manufactured almost in the same way as the conventional MOSFET, although it is necessary to change the patterns. A non-punch-through IGBT or a punch-through IGBT is obtained by replacing the n⁺-type drain layer 11 by a p⁺-type layer or by a laminate formed of an n⁺-type layer and a p⁺-type layer. This replacement is applicable also to the MOSFETs shown in FIGS. 13, 17, 18, 19, 20, 29, and 30.

Figure 17:
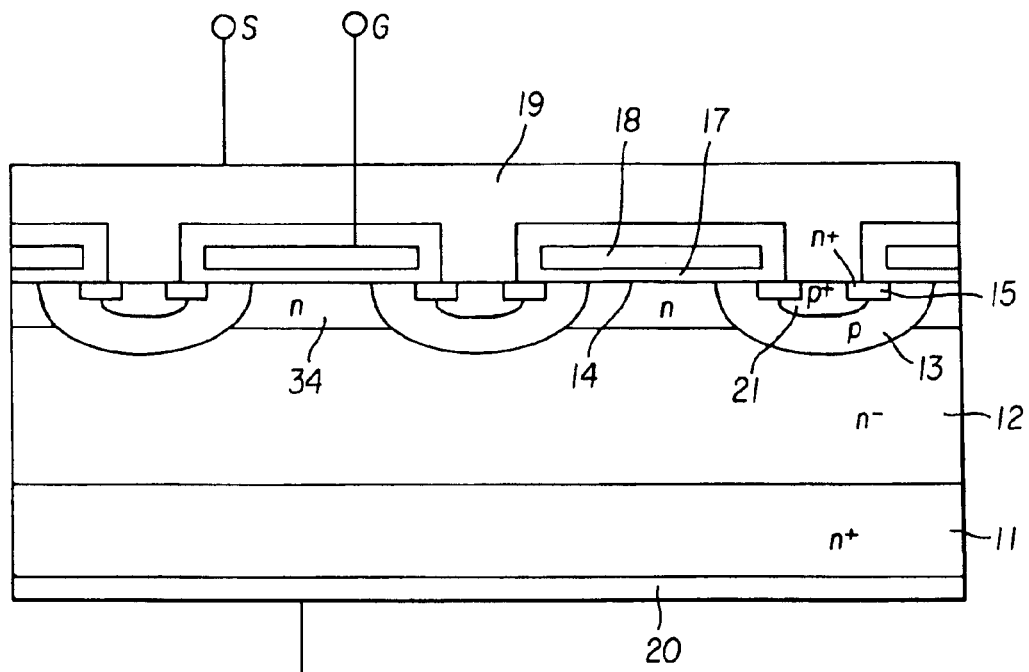
FIG. 17 is a cross sectional view showing the active region of an n-channel vertical MOSFET according to a second embodiment of the invention.
Figure 18:
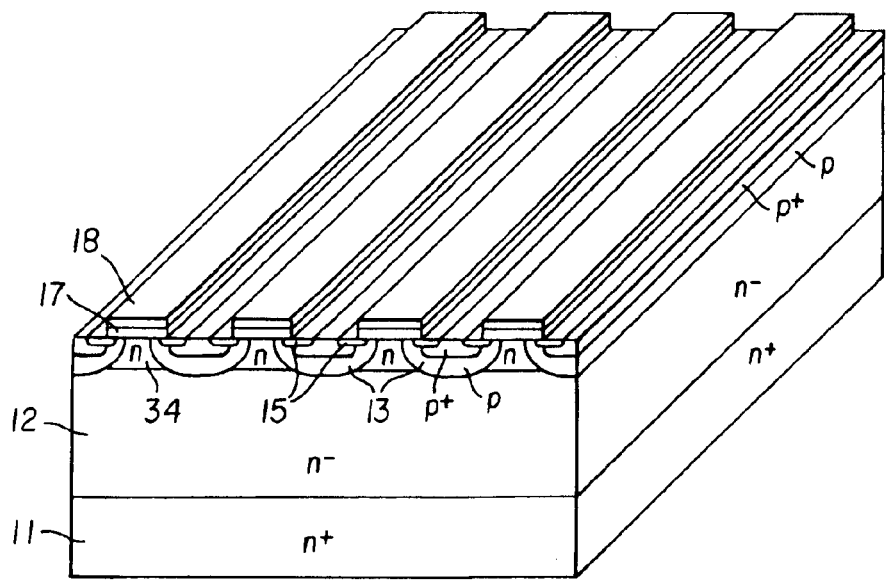
FIG. 18 is a perspective view showing the active region of the n-channel vertical MOSFET according to the second embodiment of the invention.

FIG. 17 is a cross-sectional view showing the active region of an n-channel vertical MOSFET according to a second embodiment of the invention. FIG. 18 is a perspective view showing the active region of the n-channel vertical MOSFET according to the second embodiment. The vertical MOSFET according to the second embodiment is different from the vertical MOSFET according to the first embodiment in that the n-type counter doped regions 34 are formed in the p-type well region 13 in the MOSFET according to the second embodiment in substitution for the n⁻-type surface regions 14 shown in FIG. 2 of the MOSFET according to the first embodiment.

The n-type counter doped region 34 can be formed by phosphorus ion implantation at the dose amount of from $2.0\times10^{12}$ to $5.0\times10^{12}$ cm⁻², preferably from $2.5\times10^{12}$ to $4.0\times10^{12}$ cm⁻², and by subsequent heat treatment. The depth of the n-type counter doped region 34 is about 4 μm. By forming the n-type counter doped regions 34, the JFET resistance due to the surface drain regions surrounded by the p-type well region 13 is reduced and, therefore, the series resistance component is reduced, resulting in low on-resistance. Since the surface area ratio of the surface drain regions is small according to the second embodiment, the JFET resistance increases. Therefore, it is very effective to reduce the on-resistance by counter doping.

Figure 19:
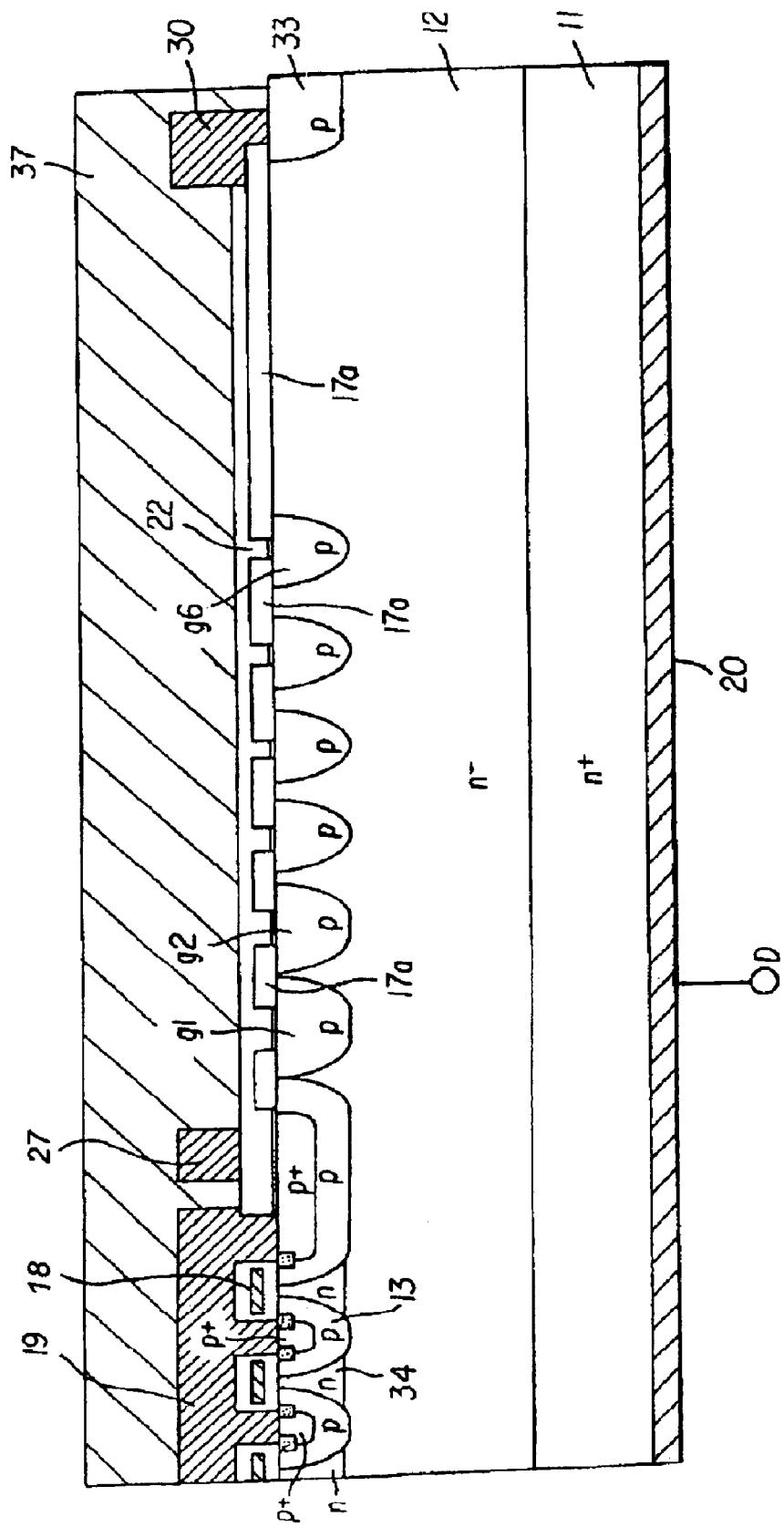
FIG. 19 is a cross sectional view showing the breakdown withstanding region of the n-channel vertical MOSFET according to the second embodiment of the invention.

FIG. 19 is a cross-sectional view showing the breakdown withstanding region of the n-channel vertical MOSFET according to the second embodiment of the invention. The breakdown withstanding structure of the vertical MOSFET according to the second embodiment is different from the breakdown withstanding structure of the vertical MOSFET according to the first embodiment shown in FIG. 13 in that the breakdown withstanding structure of the vertical MOSFET according to the second embodiment includes six guard rings for the breakdown voltage of 600 V. This number of the guard rings (6) is defined by the guard ring number expression: 1.0×Vbr/100. By setting the parameters of the constituent elements as described above, a breakdown voltage of 622 V, which is 92% of the theoretical breakdown voltage 684 V, is obtained. By increasing the number of guard rings from 6, a higher breakdown voltage can be obtained.

Figure 20:
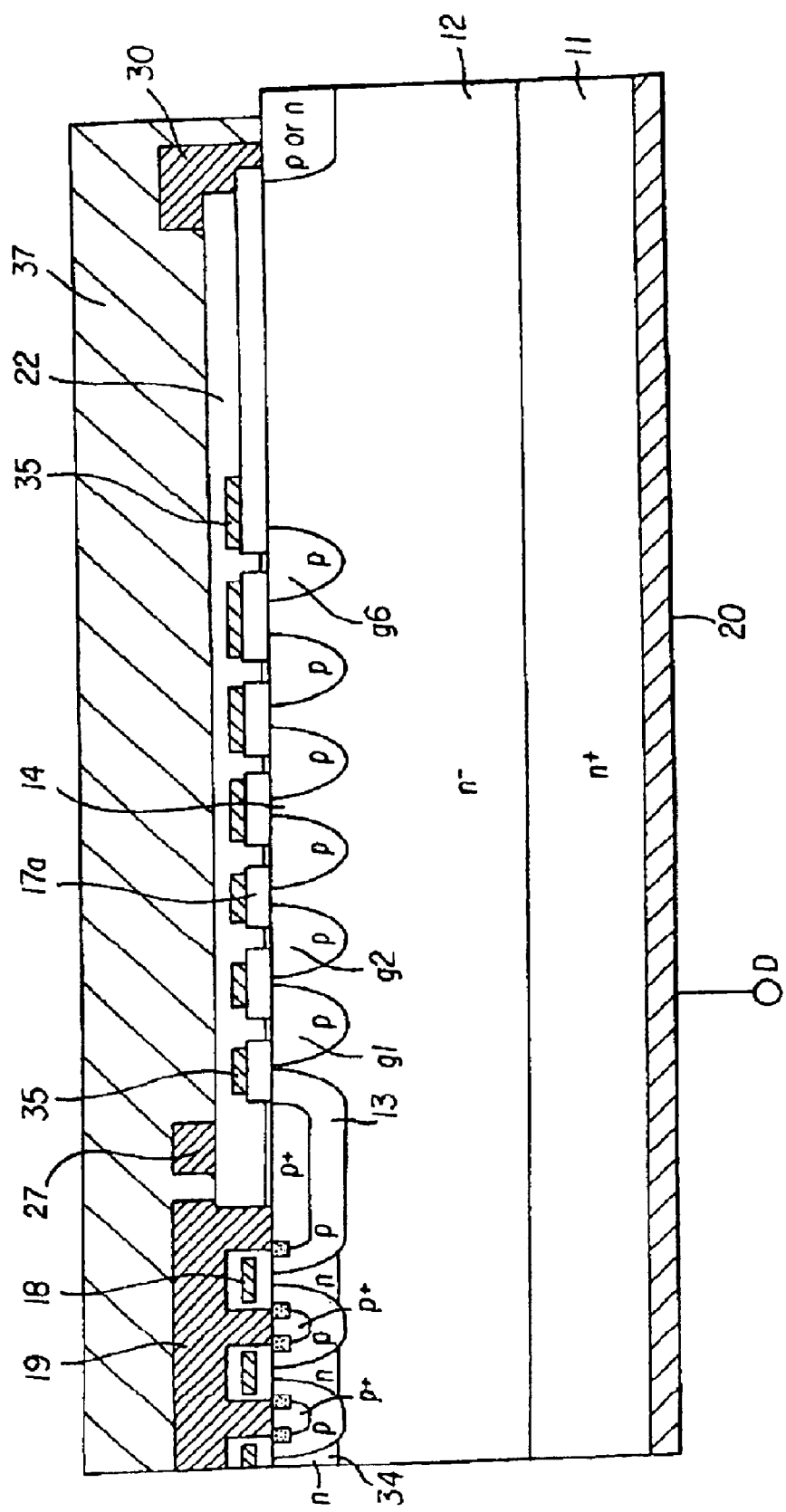
FIG. 20 is a cross sectional view showing the breakdown withstanding region of an n-channel vertical MOSFET according to a third embodiment of the invention.

FIG. 20 is a cross-sectional view showing the breakdown withstanding region of an n-channel vertical MOSFET according to a third embodiment of the invention. The breakdown withstanding structure of the vertical MOSFET according to the third embodiment is different from that of the MOSFET according to the first embodiment described with reference to FIG. 13 in that the breakdown withstanding structure according to the third embodiment includes six guard rings and electrically conductive polycrystalline silicon films 35 formed on a field oxide film 17a between adjacent p-type guard rings. A voltage is applied between drain electrode 20 and source electrode 19. The items that adversely affect the reliability under the voltage applied for a long period of time include charge accumulation in the device surface (surface charge accumulation effect). When the voltage is also applied between the electrodes in both end portions of the breakdown withstanding structure, electric charges are induced on the surface of the breakdown withstanding structure. The induced electric charges exert influences to the surface portion of the semiconductor chip, especially to the surface portion of the n$^-$-type drift layer 12, via the insulation layer, and disturb the electric field inside the semiconductor chip, resulting in an impaired breakdown voltage.

According to the third embodiment, polycrystalline silicon films 35 are positioned between the interlayer insulation film 22 and the field plates 17a on the n$^-$-type drift layer 12. The polycrystalline silicon films 35 disposed as described above facilitate suppressing the influences of the surface charges utilizing the electrostatic shield effect. The active region is immune to the surface charges, since the source electrode 19 and the gate electrode 18 cover the surface of n$^-$-type drift layer 12 in the active region. The surface charge accumulation effect is prevented and the reliability of the device is improved by arranging the polycrystalline silicon film 35 on the field oxide film 17a on the n$^-$-type surface region 14 between the p-type well region 13 and the first guard ring g$_1$ and by further arranging the polycrystalline silicon films 35 on the field oxide films 17a on the n$^-$-type surface regions 14 between adjacent guard rings. The breakdown voltage of the MOSFET according to the third embodiment is almost the same as that according to the second embodiment.

Figure 21:
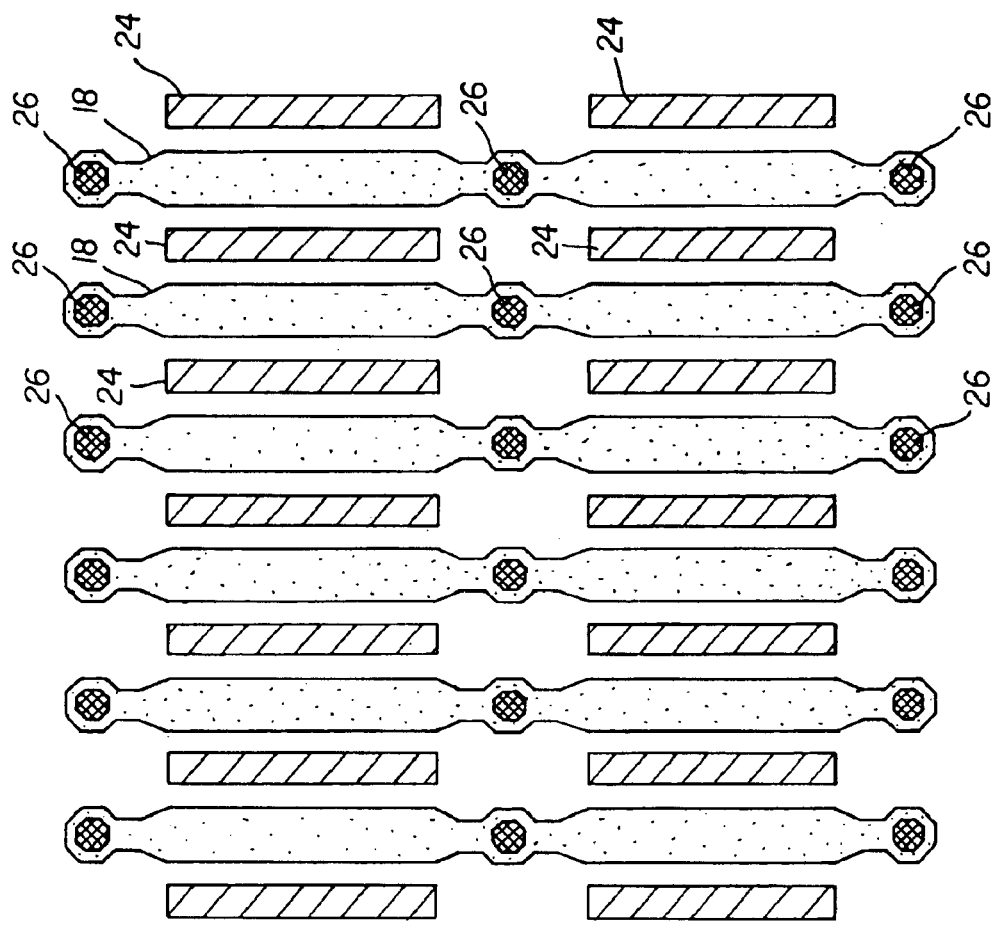
FIG. 21 is a top plan view showing the arrangement of the striped gate electrode and the source electrode on the semiconductor chip of an n-channel vertical MOSFET according to a fourth embodiment of the invention.

FIG. 21 is a top plan view showing the relative positional relationship between the stripes of the gate electrode 18 and the source electrode contact region 24 on the semiconductor chip of an n-channel vertical MOSFET according to a fourth embodiment of the invention. The breakdown withstanding structure of the MOSFET according to the fourth embodiment is the same as that of the MOSFET according to first embodiment. The arrangement shown in FIG. 21 is different from the arrangement according to the first embodiment described with reference to FIG. 4 in that each stripe of the gate electrode 18 has, in the middle portion thereof, an additional bonding section 26 for bonding the gate electrode stripe with the metal gate electrode, in addition to the bonding sections 26 formed at the tip portions of the gate electrode stripe. The additional bonding sections 26 are effective to reduce the internal gate resistance and to prevent the on-resistance from increasing. The gate electrode structure according to the fourth embodiment is more effective to more efficiently utilize the active region area than dividing each stripe of the gate electrode 18 into two segments and providing the end portions of each segment with the bonding sections 26.

In the surface portion of the semiconductor chip, the n$^-$-type surface region 14 ceases once in the middle portion thereof, leaving a first segment and starts again forming a second segment, leaving a smallest n$^-$-type surface region 14d between the first and second segments. If the machining precision is high, the smallest n$^-$-type surface region 14d will be covered. Although the bonding section 26 for bonding the gate electrode stripe with the metal gate electrode is formed in the middle portion of the gate electrode stripe according to the fourth embodiment, it is possible to add a plurality of bonding sections 26 between two bonding sections 26 in the respective end portions of a gate electrode stripe.

Figure 22:
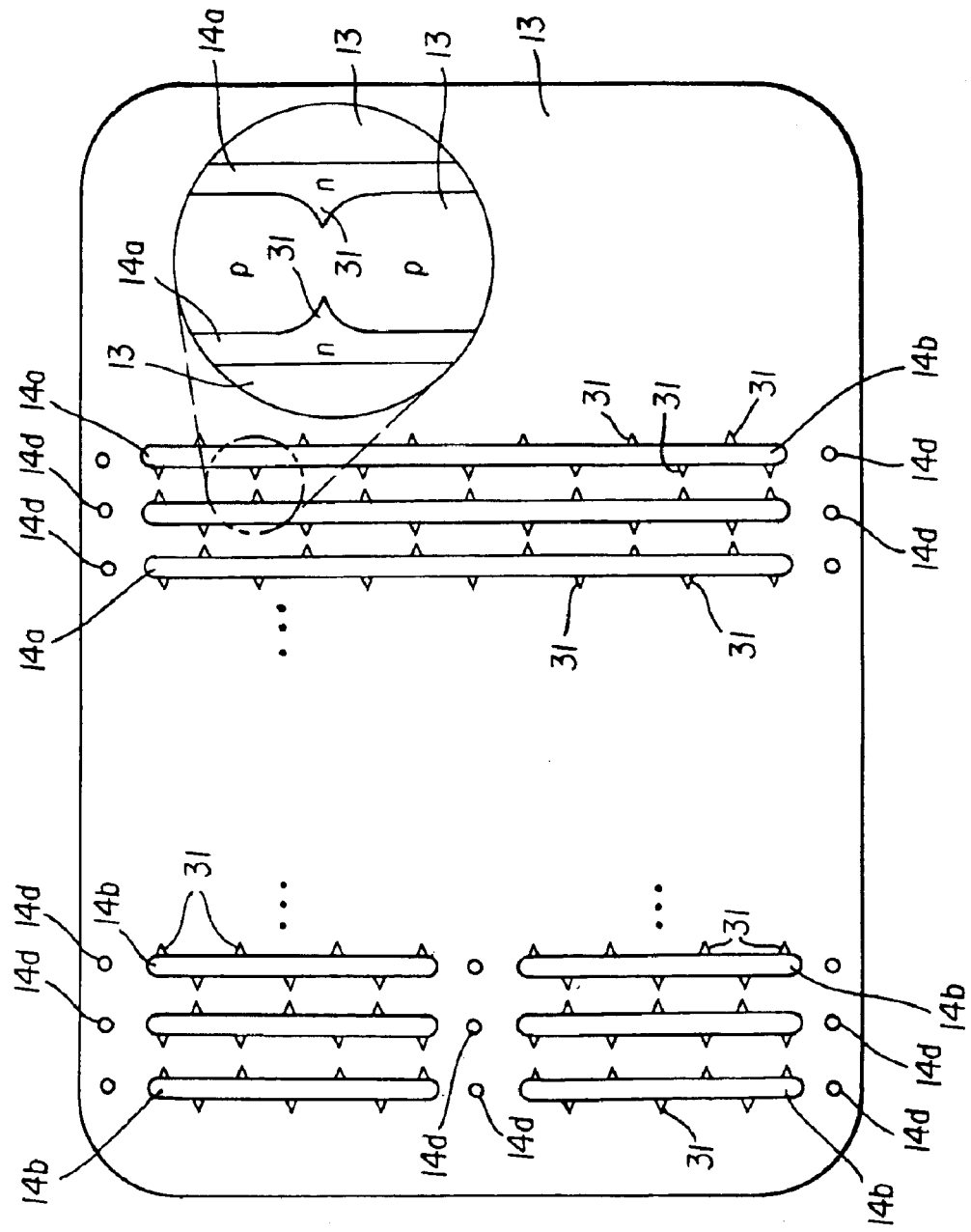
FIG. 22 is a top plan view showing the semiconductor chip surface of an n-channel vertical MOSFET according to a fifth embodiment of the invention.

FIG. 22 is a top plan view showing the semiconductor chip surface of an n-channel vertical MOSFET according to a fifth embodiment of the invention. In FIG. 22, the breakdown withstanding structure of the MOSFET according to the fifth embodiment is omitted in the same way as in FIG. 1. The breakdown withstanding structure of the MOSFET according to the fifth embodiment is the same as that of the MOSFET according to the first embodiment. In FIG. 22, the n$^-$-type surface regions 14, some of which are represented by dots, are stripe shaped with respective stripes extending in one direction and surrounded by the p-type well region 13 essentially in the same manner as the n$^-$-type surface regions 14 according to the first embodiment shown in FIG. 1. Here, the n$^-$-type surface regions 14 are different from the n$^-$-type surface regions 14 shown in FIG. 1 in that the n$^-$-type surface regions 14 according to the fifth embodiment extend in one direction and have convex or protruding portions 31 protruding substantially or almost perpendicular to the extending direction of the n$^-$-type surface regions 14. One convex portion 31 is formed along every 250 μm length of the gate electrode stripe. The protruding length of convex portions 31 in the direction perpendicular to the extending direction of the n$^-$-type surface regions 14 is 0.5 μm.

Figure 23:
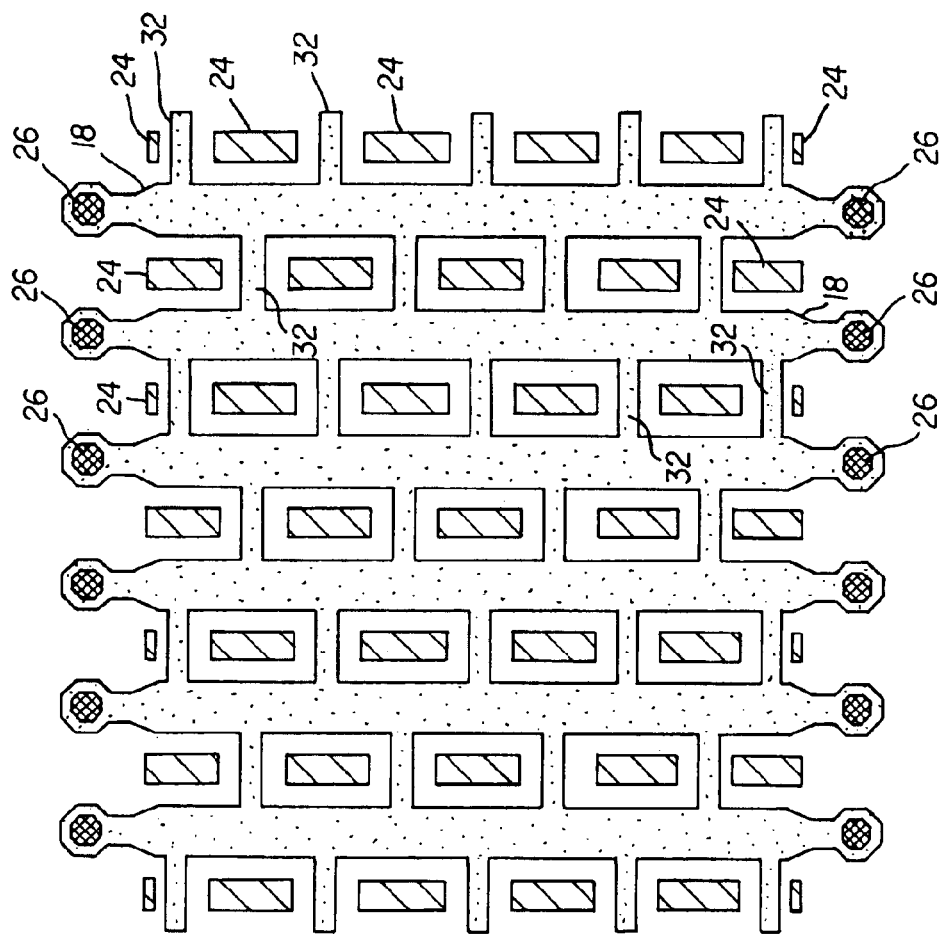
FIG. 23 is a top plan view showing the arrangement of the striped gate electrode and the source electrode on the semiconductor chip of the MOSFET according to the fifth embodiment.

FIG. 23 is a top plan view showing the shape of the gate electrode 18, which works as a mask for forming the constituent regions in the surface portion of the semiconductor chip shown in FIG. 22, and the relative positional relationship between the stripes of the gate electrode 18 and the source electrode contact region 24 in the surface of the semiconductor chip of the n-channel vertical MOSFET according to the fifth embodiment of the invention.

The shape of the gate electrode 18 in FIG. 23 is different from the shape of gate electrode 18 in FIG. 4 in that the gate electrode 18 in FIG. 23 includes bridges 32 extending perpendicular to the stripes of the gate electrode 18 and connecting the stripes of the gate electrode 18. The gate electrode bridge 32 is formed along every 250 μm length of the gate electrode stripe. The width of the gate electrode bridge 32 is set at 2.5 μm.

When the p-type well region 13 is formed by introducing impurity ions through the gate electrode 18 used for a mask, diffusion regions of the p-type well region 13 driven from both sides of the bridge 32 are connected to each other below the bridge 32 such that a stripe of the p-type well region 13 is formed between the adjacent stripes of the gate electrode 18 as the lateral diffusion length of the p-type well region 13 paralleling the semiconductor chip surface is set at 2 µm. However, since the diffusion regions of the p-type well region 13 driven from both sides of bridge 32 are not connected to each other below the bases of bridge 32, the convex portions 31 are left on both sides of the n⁻-type surface regions 14. Since the stripes of the gate electrode 18 are connected via the bridges 32 according to the fifth embodiment, the gate resistance is reduced and the on-resistance is also reduced.

Figure 24:
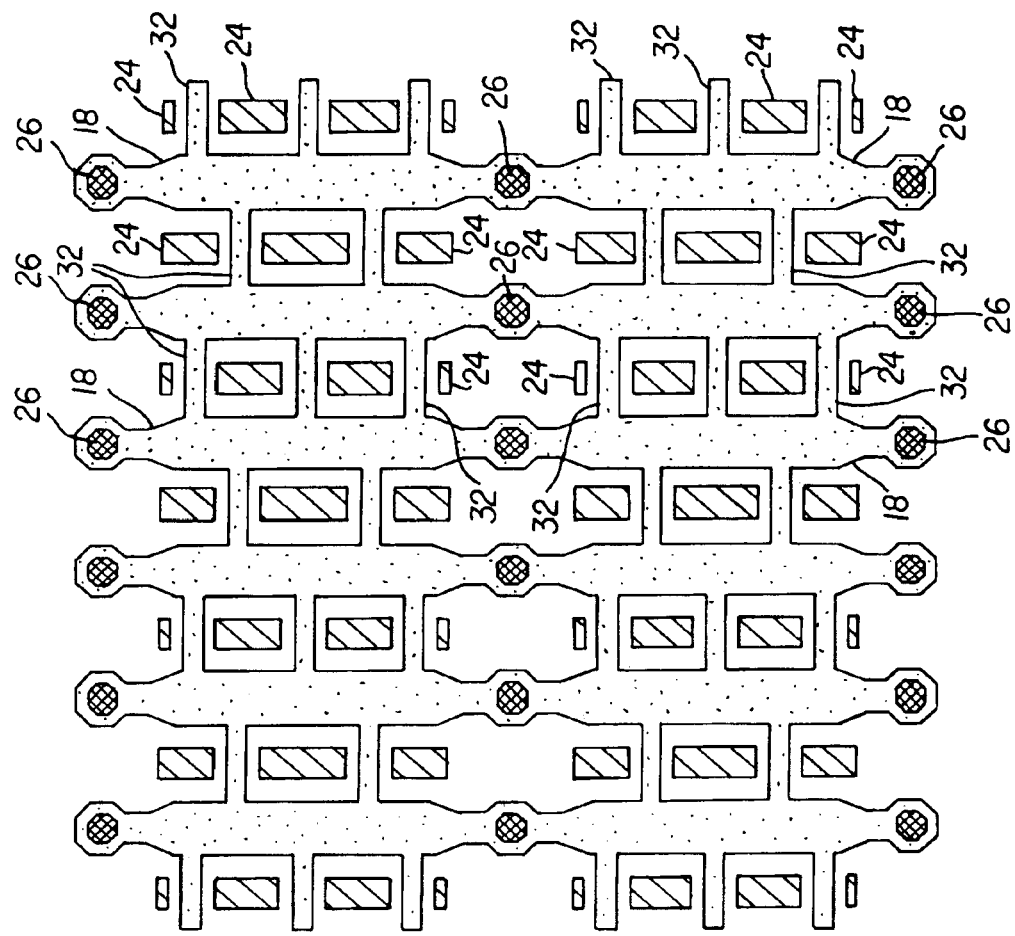
FIG. 24 is a top plan view showing the arrangement of the striped gate electrode and the source electrode on the semiconductor chip of the MOSFET according to a sixth embodiment of the invention.

FIG. 24 is a top plan view showing the shape of the gate electrode 18 and the relative positional relationship between the stripes of the gate electrode 18 and the source contact region 24 on the semiconductor chip of an n-channel vertical MOSFET according to a sixth embodiment of the invention. The breakdown withstanding structure of the MOSFET according to the sixth embodiment is the same as that of the MOSFET according to the first embodiment. The shape of the gate electrode 18 according the sixth embodiment is different from the shape of the gate electrode 18 according the fifth embodiment shown in FIG. 23 in that each stripe of the gate electrode 18 has, in the middle portion thereof, an additional bonding section 26 for bonding the gate electrode stripe with the metal gate electrode, in addition to the bonding sections 26 formed in the tip portions of the gate electrode stripe. The additional bonding sections 26 are effective to reduce the internal gate resistance and to prevent the on-resistance from increasing. The gate electrode structure according to the sixth embodiment is more effective to more efficiently utilize the active region area than dividing each stripe of gate electrode 18 into two segments and providing the end portions of each segment with bonding sections 26.

In the surface portion of the semiconductor chip, the n⁻-type surface region 14 ceases once in the middle portion thereof leaving a first segment and starts again forming a second segment leaving a smallest n⁻-type surface region 14d between the first and second segments. If the machining precision is high, the small n⁻-type surface region 14d will be covered.

Although a bonding section 26 for bonding the gate electrode stripe with the metal gate electrode is formed in the middle portion of the gate electrode stripe according to the sixth embodiment, it is possible to add a plurality of bonding sections 26 between two bonding sections 26 in the respective end portions of a gate electrode stripe.

Figure 25:
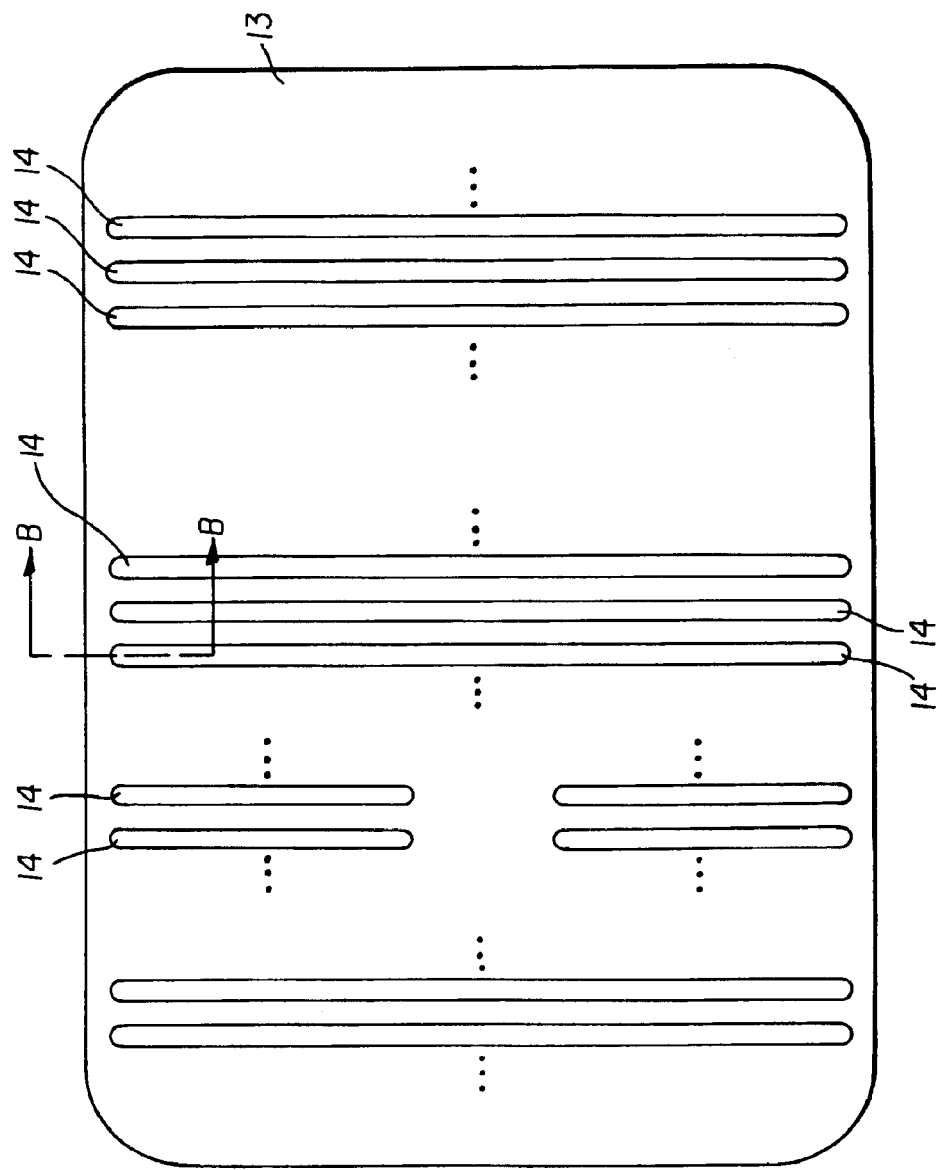
FIG. 25 is a top plan view showing the semiconductor chip surface of an n-channel vertical MOSFET according to a seventh embodiment of the invention.

FIG. 25 is a top plan view showing the semiconductor chip surface of an n-channel vertical MOSFET according to a seventh embodiment of the invention. In FIG. 25, the breakdown withstanding structure of the MOSFET according to the seventh embodiment is omitted in the same way as in FIG. 1. The breakdown withstanding structure of the MOSFET according to the seventh embodiment is the same as that of the MOSFET according to the first embodiment. In FIG. 25, the n⁻-type surface regions 14, some of which are represented by dots, are shaped with respective stripes extending parallel to each other in one direction. The stripes of the n⁻-type surface regions 14 are surrounded by the p-type well region 13.

Figure 26:
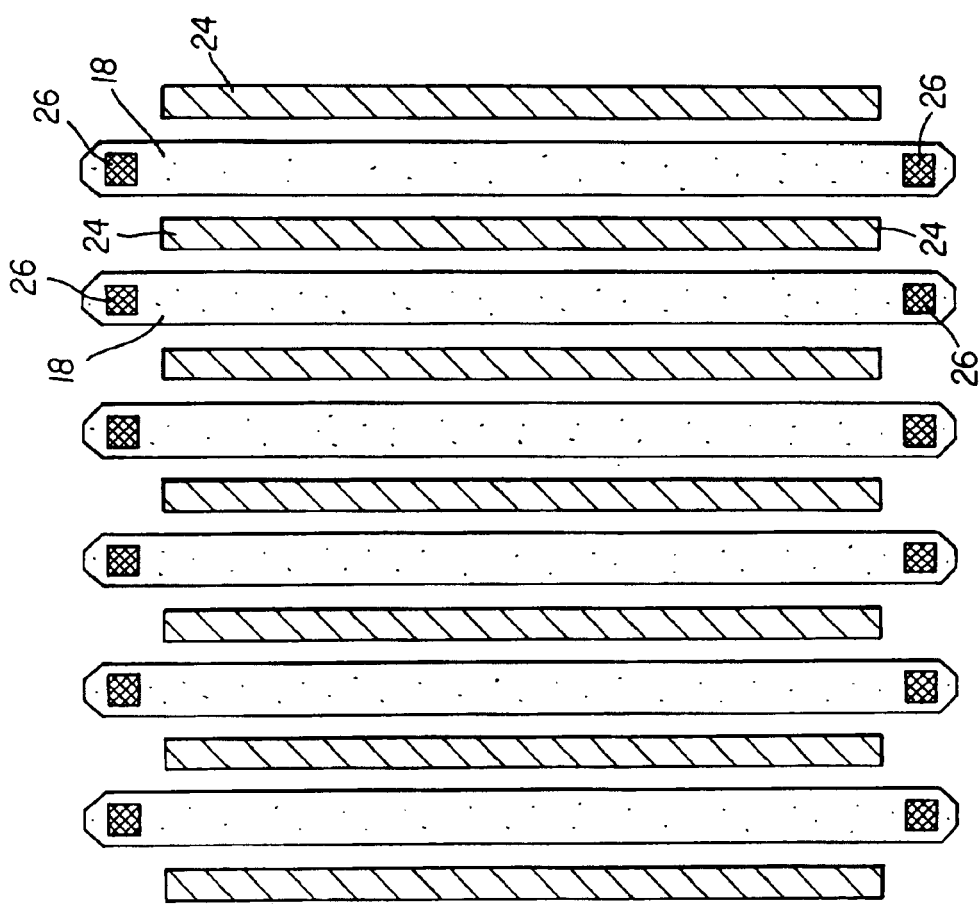
FIG. 26 is a top plan view showing the arrangement of the striped gate electrode and the source electrode on the semiconductor chip of the MOSFET according to the seventh embodiment.

FIG. 26 is a top plan view showing the shape of the gate electrode 18 and the relative positional relationship between the stripes of the gate electrode 18 and the source contact region 24 on the semiconductor chip of the n-channel vertical MOSFET according to the seventh embodiment of the invention. A plurality of stripes of the gate electrode 18 extend in one direction. The shape of the gate electrode 18 according to the seventh embodiment is different from the shape of the gate electrode according to the first embodiment shown in FIG. 4 in that the width of the gate electrode stripe is constant over the length thereof. Bonding sections 26 for bonding each gate electrode stripe with the metal gate electrode can be formed within the width of the gate electrode stripe by employing very precise machining techniques.

Figure 27:
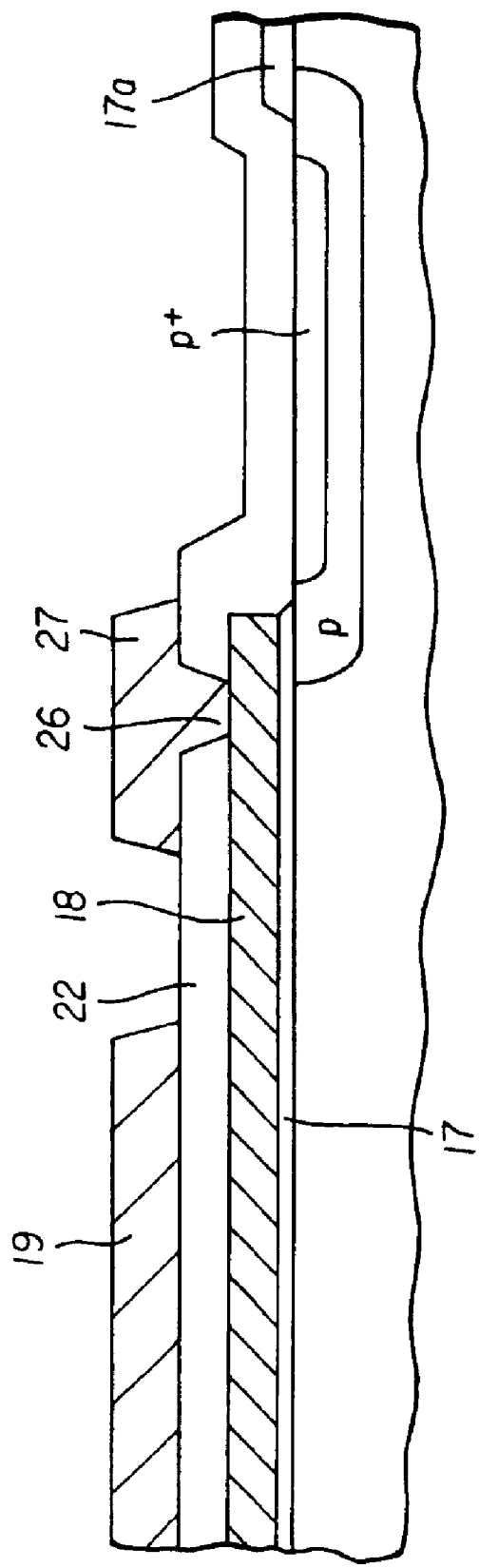
FIG. 27 is a cross section taken along line B—B of FIG. 25, showing the connection of the gate electrode and the metal gate electrode in the bonding section.

FIG. 27 is a cross section taken along line B—B of FIG. 25. FIG. 27 shows the connection of the gate electrode 18 and the metal gate electrode 27 formed in the bonding section 26. In this figure, a gate oxide film 17, a thick field oxide film 17a, and a source electrode 19 are shown. The n⁻-type surface region 14d of the similar cross section, shown in FIG. 5, of the MOSFET according to the first embodiment is not formed in the cross section shown in FIG. 27. The location on the surface electrode structure taken along line B—B corresponds to the segment taken along line B—B of FIG. 3.

Although the corners of the terminal end portion of a stripe of gate electrode 18 are cut off according to the seventh embodiment so as not to leave any acute angle corner, the right angle corners left in the terminal end portion of a gate electrode stripe do not adversely affect the functions and effects of the present invention.

Figure 28:
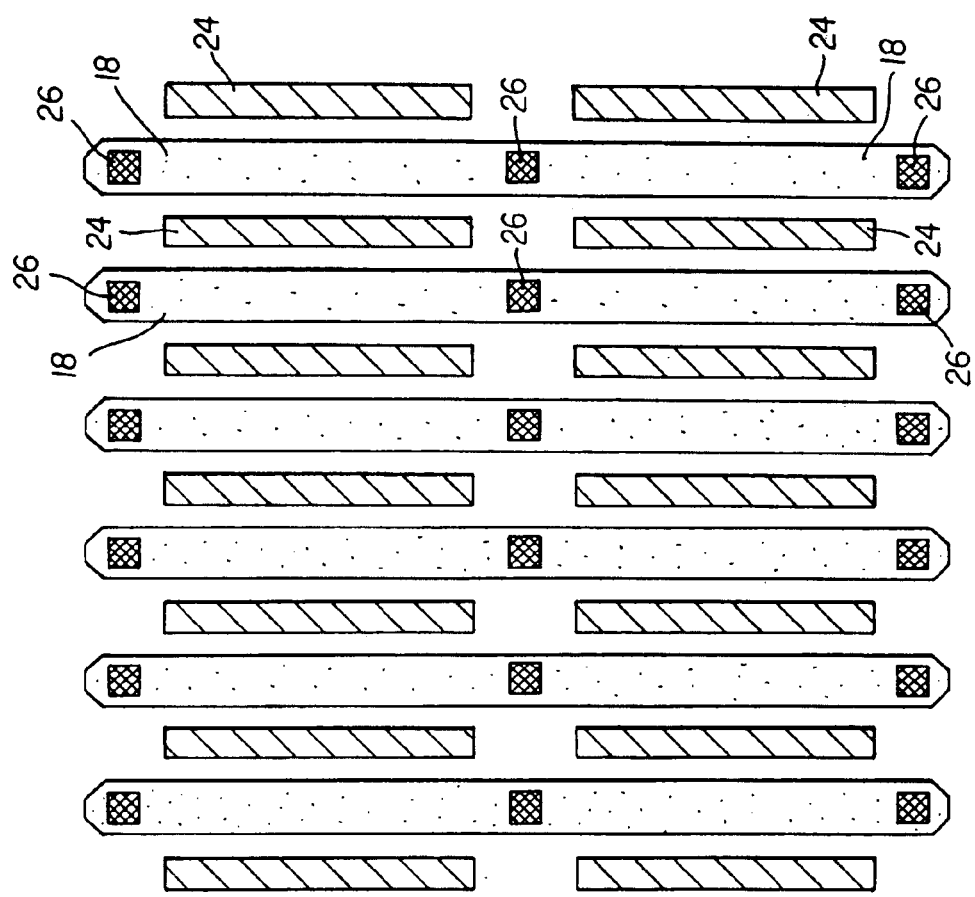
FIG. 28 is a top plan view showing the arrangement of the striped gate electrode and the source electrode on the semiconductor chip of the MOSFET according to an eighth embodiment of the invention.

FIG. 28 is a top plan view showing the shape of gate electrode 18 and the relative positional relationship between the stripes of gate electrode 18 and source contact region 24 on the semiconductor chip of an n-channel vertical MOSFET according to an eighth embodiment of the invention. The breakdown withstanding structure of the MOSFET according to the eighth embodiment is the same as that of the MOSFET according to the first embodiment. The arrangement shown in FIG. 28 is different from the arrangement according to the seventh embodiment described with reference to FIG. 26 in that each stripe of the gate electrode 18 has, in the middle portion thereof, an additional bonding section 26 for bonding the gate electrode stripe with the metal gate electrode, in addition to bonding sections 26 formed at the tip portions of the gate electrode stripe. The additional bonding sections 26 are effective to reduce the internal gate resistance and to prevent the on-resistance from increasing. The gate electrode structure according to the eighth embodiment is more effective to more efficiently utilize the active region area than dividing each stripe of the gate electrode 18 into two segments and providing the end portions of each segment with the bonding sections 26.

Figure 29:
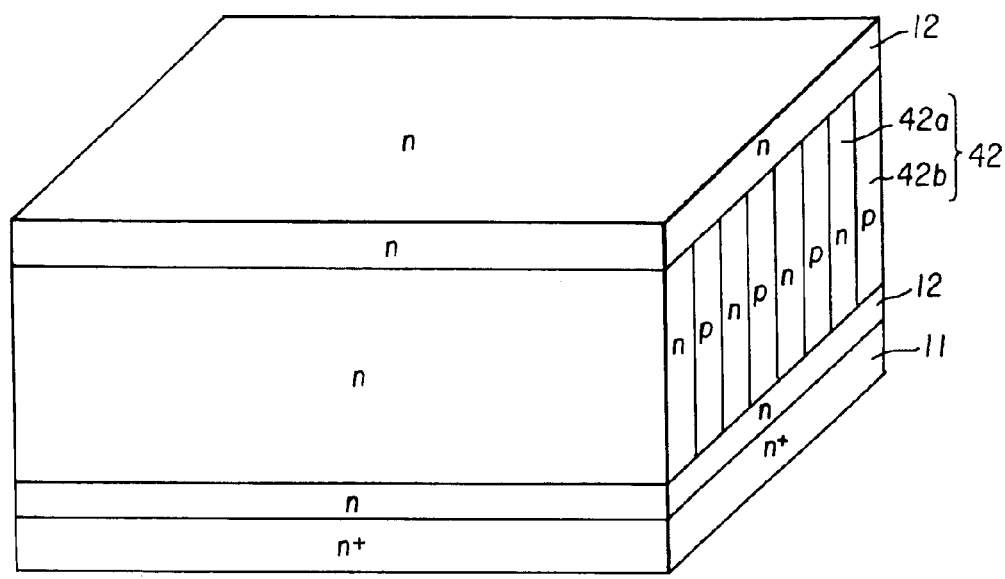
FIG. 29 is a perspective cross sectional view of the breakdown-voltage sustaining layer of an n-channel vertical MOSFET according to a ninth embodiment of the invention.

FIG. 29 is a perspective cross-sectional view of the breakdown-voltage sustaining layer of an n-channel vertical MOSFET according to a ninth embodiment of the invention. The n-channel vertical MOSFET according to the ninth embodiment includes an alternating conductivity type layer 42 on an n-type drain layer 11 having a low resistance. The alternating conductivity type layer 42 is formed of n-type drift regions 42a and p-type partition regions 42b arranged alternately. The n-channel vertical MOSFET according to the ninth embodiment also includes n⁻-type drift layers 12, 12 formed on and below alternating conductivity type layer 42. The upper structure, including the p-type well region 13, is formed on the upper n⁻-type drift layer 12.

Figure 30:
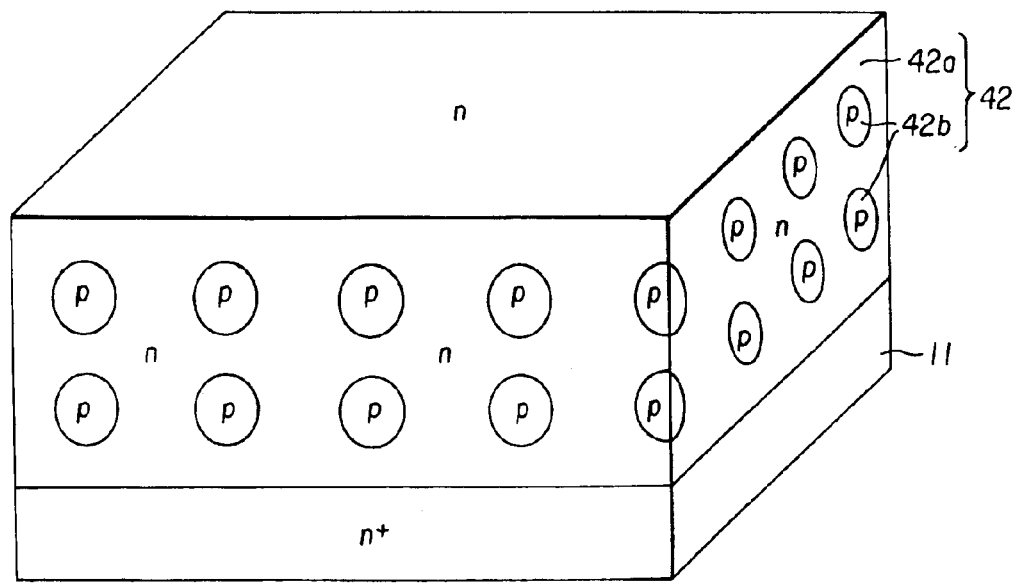
FIG. 30 is a perspective cross sectional view showing the breakdown-voltage sustaining layer of an n-channel vertical MOSFET according to a tenth embodiment of the invention.

FIG. 30 is a perspective cross-sectional view showing the breakdown-voltage sustaining layer of an n-channel vertical MOSFET according to a tenth embodiment of the invention. Referring now to FIG. 30, the MOSFET according to the tenth embodiment includes an n-type drain layer 11, and an alternating conductivity type layer 42 formed of an n-type drift region 42a and p-type partition regions 42b on an n-type drain layer 11. According to the tenth embodiment, the p-type partition region 42b is not shaped as a thin plate but as a sphere. The spheres of the p-type partition regions 42b are distributed uniformly and embedded in the n-type drift region 42a. By doping the n-type drift region 42a and the p-type partition regions 42b at the respective appropriate impurity concentrations, the alternating conductivity type structure as described above is employed effectively.

Although the invention has been described in connection with the embodiments thereof, any of the active regions and any of the breakdown withstanding regions described above may be combined appropriately, since the active regions and the breakdown withstanding regions are independent from each other. Moreover, the breakdown withstanding structures according to the inventions are applicable not only to the semiconductor devices having a MOS gate but also to all the vertical semiconductor devices, including bipolar semiconductor devices, such as bipolar transistors and diodes.

By setting the resistivity $\rho$ and the thickness t of the main portion of the breakdown-voltage sustaining layer of the first conductivity type below the well region of the second conductivity type within the respective specific ranges, depending on the breakdown voltage of the semiconductor device, the tradeoff relation between the on-resistance and the breakdown voltage can be reduced. The resulting semiconductor device is provided with a high breakdown voltage and low on-resistance.

In the MOS semiconductor devices according to the invention, the surface drain regions of the first conductivity type, which regions are the extending portions of the breakdown-voltage sustaining layer extending to the surface of the semiconductor chip, are surrounded by the well region of the second conductivity type. The ratio between the surface area of the surface drain regions of the first conductivity type and the surface area of the well region of the second conductivity type including the source region of the first conductivity type is set within the range of 0.01 and 0.2. Each of the surface drain regions is stripe shaped, having a width of 0.1 to 2 $\mu$m. The MOS semiconductor devices according to the invention constructed as described above reduce the tradeoff relation between the on-resistance and the breakdown voltage greatly. Although the breakdown voltage of the MOS semiconductor devices according to the invention is high, the on-resistance and the switching loss of the MOS semiconductor devices according to the invention are low.

The breakdown withstanding structures according to the invention, which are provided with many guard rings positioned in close proximity to each other considering the designed breakdown voltage, can realize 97% of the theoretical breakdown voltage for the flat pn-junction. The improved breakdown voltage facilitates the use of a thin Si substrate, which further facilitates reduction of the on-resistance.

Moreover, the MOS semiconductor devices according to the invention can be manufactured through the conventional semiconductor process. The MOS semiconductor devices according to the invention facilitate to improve the characteristics thereof greatly by merely changing the patterns for forming the constituent regions. The MOS semiconductor devices according to the invention are especially applicable in the field of power semiconductor device.

A semiconductor device according the present invention for instance can include a semiconductor chip, a layer having low electrical resistance of a first conductivity type or a second conductivity type in the bottom portion of the semiconductor chip, a breakdown-voltage sustaining layer of the first conductivity type above the low electrical resistance layer, and a well region of the second conductivity type in the surface portion of the breakdown-voltage sustaining layer. The resistivity $\rho$ ($\Omega$cm) of the main portion of the breakdown-voltage sustaining layer below the well region can be expressed, using the breakdown voltage of the semiconductor device, as $-5.43+0.0316$ Vbr$<\rho<-8.60+0.0509$ Vbr, $-5.43+0.0316$ Vbr$<\rho<-7.71+0.0456$ Vbr, or $-5.43+0.0316$ Vbr$<\rho<-6.82+0.0404$ Vbr.

For instance, when the breakdown voltage Vbr of the semiconductor device is 1000 V, the maximum resistivity lower than $-8.60+0.0509$ Vbr is 42.3 $\Omega$cm, the maximum resistivity lower than $-7.71+0.0456$ Vbr is 37.89 $\Omega$cm, and the maximum resistivity lower than $-6.82+0.0404$ Vbr is 33.58 $\Omega$cm. These resistivity values are much smaller than the conventional resistivity 58.34 $\Omega$cm, indicating the possibility of realizing semiconductor devices exhibiting low on-resistance. For obtaining the low on-resistance, it is very effective to select the resistivity $\rho$ and the thickness t in the range of the breakdown voltage between 100 V and 5000V. And, remarkable low on-resistance is obtained by selecting the resistivity $\rho$ and the thickness t in the range of the breakdown voltage between 200 V and 2000V.

The thickness t ($\mu$m) of the portion of the breakdown-voltage sustaining layer between the well region and the low electrical resistance layer can be expressed, using the breakdown voltage of the semiconductor device, as $1.26+0.0589$ Vbr$<t<1.96+0.0916$ Vbr, or $1.26+0.0589$ Vbr$<t<1.68+0.0785$ Vbr. When the breakdown voltage Vbr is 1000 V, the maximum thickness thinner than $1.96+0.0916$ Vbr is 93.56 $\mu$m, and the maximum thickness thinner than $1.68+0.0785$ Vbr is 80.18 $\mu$m. These maximum thickness values are thinner than the conventional thickness, i.e., 100 $\mu$m.

More specifically, the MOS type semiconductor device further includes a source region of the first conductivity type in the surface portion of the well region, a gate electrode above the extended portion of the well region, with a gate insulation film interposed therebetween. The extended portion of the well region can adjoin the source region. The MOS type semiconductor device further includes a source electrode in electrical contact commonly with the well region and the source region and a drain electrode on the back surface of the low electrical resistance layer.

The surface drain regions of the first conductivity type, which are the extended portions of the breakdown-voltage sustaining layer extending to the surface of the semiconductor chip, are surrounded by the well region of the second conductivity type. In contrast to the conventional devices, in which the well regions of the second conductivity type are surrounded by the surface drain region of the first conductivity type, the semiconductor device according to the invention facilitates suppressing the increase of the electric field strength caused by the shape effect of the well region to obtain a high breakdown voltage even when the resistance of the breakdown-voltage sustaining layer is low. The breakdown-voltage sustaining layer with a low resistance facilitates to reduce the on-resistance of the semiconductor device.

By reducing the ratio between the total surface area of the surface drain regions surrounded by the well region and the surface area of the well region, including the source region and having a MOS structure, the capacitance Crss between the surface drain region and the gate electrode, facing each other across the gate insulation film, is reduced. However, the on-resistance becomes high as described earlier when the above described surface area ratio of the surface drain regions is reduced.

FIG. 6 illustrates the surface area ratio of the surface drain regions of the first conductivity type thereof, which can be different from device to device, the capacitance Crss between the gate and the drain, and the on-resistance. The horizontal axis represents the ratio between the total surface area of the surface drain regions and the surface area of the well region including the source region, the vertical axis on the left hand side of figure the capacitance Crss, and the vertical axis on the right hand side the on-resistance Ron. The n-channel MOSFETs are configured according to the first embodiment of the invention, with the area of the active region having about 16 mm². The surface drain region is 3.6 mm in length.

FIG. 6 indicates that the capacitance Crss increases with the increasing surface area ratio of the surface drain region. Therefore, it is desirable to reduce the surface area ratio as much as possible. To reduce the capacitance Crss to 15 pF or smaller, which is acceptable for the practical device, it is desirable that the surface area ratio be 0.23 or smaller. The on-resistance Ron is the lowest in the surface area ratio range of 0.15 and 0.2. The on-resistance Ron increases gradually as the surface area ratio increases above 0.2. The on-resistance Ron increases sharply as the surface area ratio decreases below 0.15. To reduce the capacitance Crss to the value twice as high as the minimum capacitance acceptable for the practical device or smaller, it is desirable that the surface area ratio be 0.01 or larger.

Considering these results, it is preferable for the surface area ratio to be within the range of 0.01 and 0.2. The surface area ratio within the above described preferable range facilitates to obtain a MOS semiconductor device exhibiting low on-resistance and low capacitance Crss.

Advantageously, each surface drain region according to the present invention is stripe shaped having a relatively long length in relationship with its width. Since the stripes of the surface drain regions of the first conductivity type are surrounded by the well region of the second conductivity type, it is possible to suppress the increase of the electric field strength caused by the shape effect of the well region and to obtain a high breakdown voltage even when the resistance of the breakdown-voltage sustaining layer is low. These effects are not obtained by the conventional structure where the well regions of the second conductivity type are surrounded by the surface drain region of the first conductivity type.

The stripe of the surface drain region can be set from 0.1 to 2 μm in width in the main portion thereof. By reducing the width of the surface drain region, it becomes possible to reduce the capacitance Crss between the surface drain region and the gate electrode facing each other across the gate insulation film. However, the narrow stripe of the surface drain region causes high on-resistance.

Figure 7:
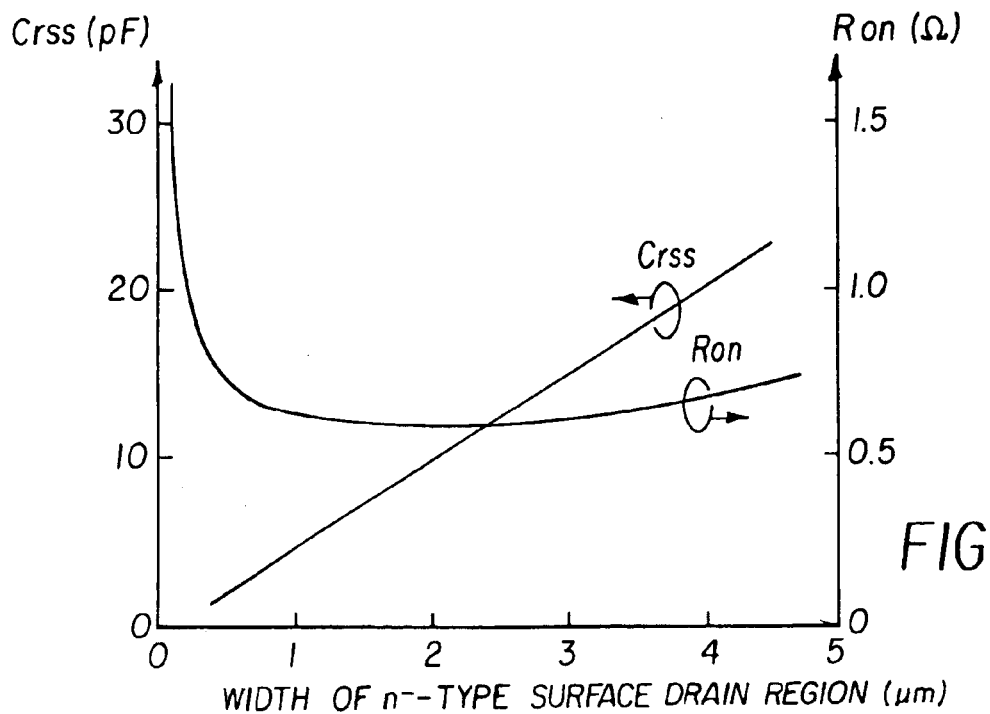
FIG. 7 is a characteristic diagram relating the width of the n-type surface drain regions, the capacitance Crss, and the on-resistance Ron of the experimental n-channel vertical MOSFETs with each other.

FIG. 7 illustrates the relations of experimental devices among the width of the surface drain regions, the capacitance Crss, and the on-resistance. In the figure, the horizontal axis represents the width of the surface drain region, the vertical axis on the left hand side of the figure the capacitance Crss, and the vertical axis on the right hand side the on-resistance Ron. The surface drain regions are 3.6 mm in length. As FIG. 7 indicates, the capacitance Crss increases in proportion to the width of the surface drain regions. Therefore, it is desirable for the width of the surface drain regions to be as narrow as possible. To reduce the capacitance Crss to 15 pF or smaller, which is acceptable for the practical device, it is desirable that the width of the surface drain regions be 3 μm or narrower.

The on-resistance Ron is the lowest in the range, in which the stripe width of the surface drain regions is from 1.5 to 2.0 μm. The on-resistance Ron increases gradually as the stripe width exceeds 2.5 μm. The on-resistance Ron increases sharply as the stripe width decreases below 1 μm. To reduce the on-resistance to the value twice as high as the minimum on-resistance acceptable for the practical device or lower, it is desirable that the stripe width of the surface drain regions be 0.1 μm or wider.

As described above, there exists a tradeoff relation between the on-resistance and the capacitance Crss in the range, where the surface drain region is short. For realizing practically low on-resistance and practically low capacitance Crss, it is preferable that the capacitance Crss be 15 pF or smaller, and the on-resistance be 1.5Ω or lower. Therefore, the desirable width of the surface drain region of the first conductivity is set within the range of 0.1 μm and 2 μm. If the capacitance Crss is small, the switching loss will be reduced.

When the width of the main portion of the stripe-shaped surface drain region is wide, the electric field in the surface portion of the semiconductor chip rises, causing a low breakdown voltage. In contrast, when the width of the main portion of the surface drain region described above is narrow, the JFET resistance increases, causing high on-resistance. However, it is possible to obtain a semiconductor device, which facilitates to prevent the breakdown voltage from reducing and the on-resistance from increasing, by defining the optimum ranges of the dimensions as described above.

When the surface drain regions of the first conductivity type are shaped with respective stripes, it becomes possible to reduce the capacitance Crss between the surface drain regions and gate electrode facing each other across the gate insulation film by reducing the ratio between the surface area of the surface drain regions surrounded by the well region and the sum of the surface areas of the well region and the source region. Although the on-resistance increases in association with the reduction of the capacitance Crss, it is possible to obtain a semiconductor device with the breakdown voltage thereof not reduced, the on-resistance increase thereof within the acceptable range, and the capacitance Crss thereof suppressed at a small value, by limiting the surface area ratio of the surface drain regions of the first conductivity type as described above.

When the stripes of the surface drain regions are long, the on-resistance is low since the channel width for the same area is widened. However, since the long stripes of the surface drain regions cause high gate resistance inside the device, a long switching time is caused, further causing a large switching loss.

When the stripe of the surface drain region is substantially shortened by disposing the gate electrode in the middle portions thereof and by such arrangements, the gate resistance inside the device is reduced, switching time is shortened and, therefore, the switching loss is reduced. However, it provides high on-resistance since the channel width for a same area becomes narrow. In short, it is important to limit the length of the surface drain regions of the first conductivity type within an appropriate range.

Figure 8:
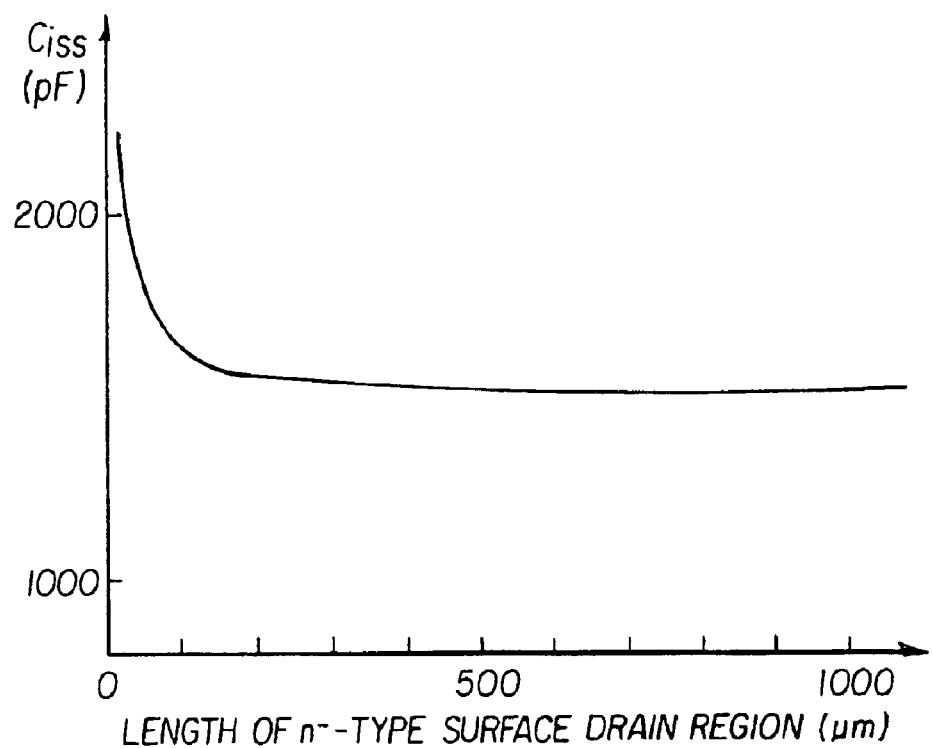
FIG. 8 is a characteristic diagram relating the length of the n-type surface drain regions and the input capacitance Ciss of the experimental n-channel vertical MOSFETs with each other.
Figure 9:
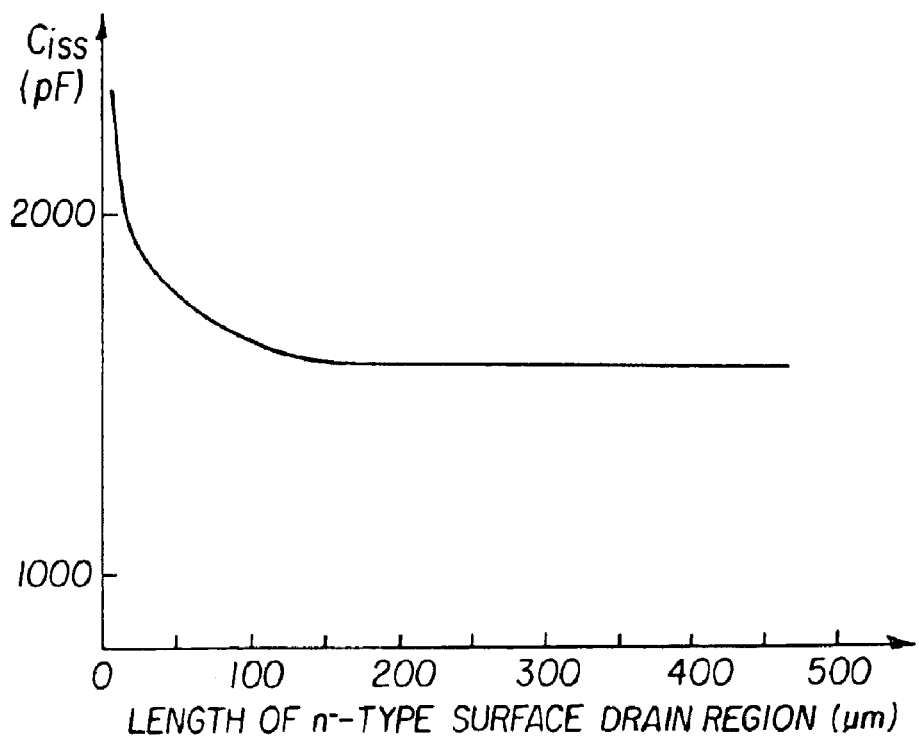
FIG. 9 is another characteristic diagram relating the length of the n-type surface drain regions and the input capacitance Ciss of the experimental n-channel vertical MOSFETs with each other.
Figure 10:
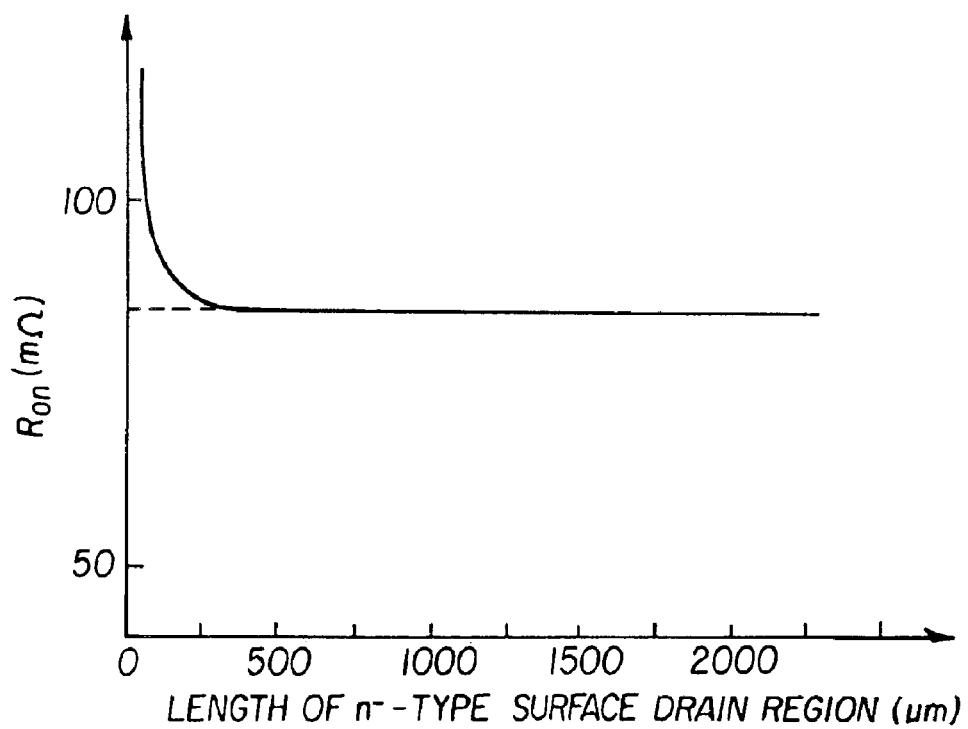
FIG. 10 is a characteristic diagram relating the length of the n-type surface drain regions and the on-resistance Ron of the experimental n-channel vertical MOSFETs with each other.
Figure 11:
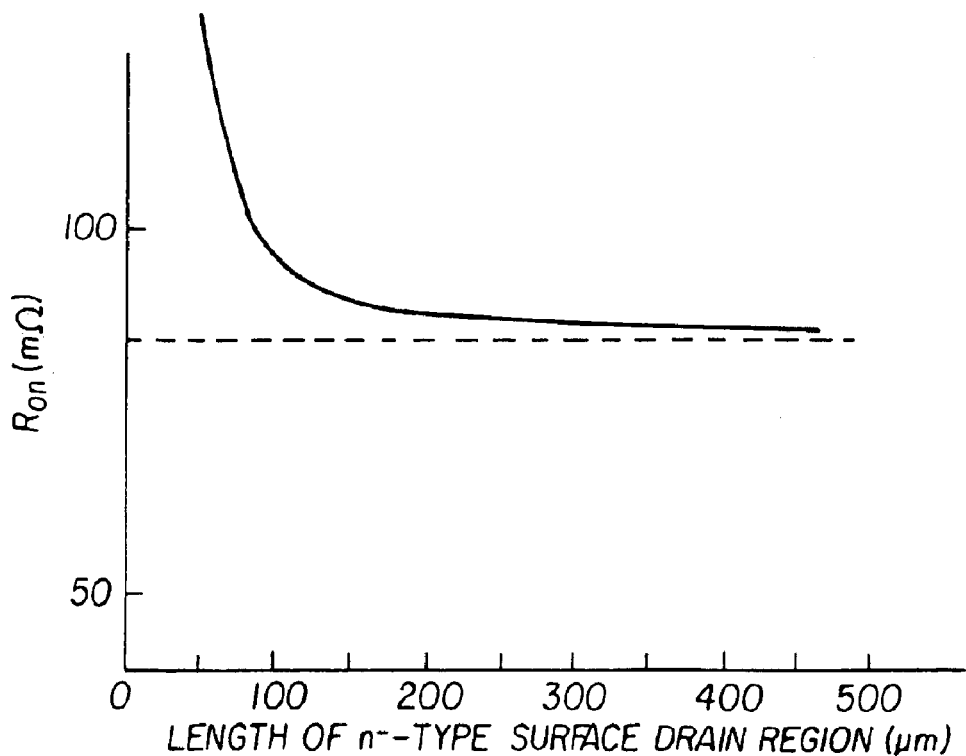
FIG. 11 is another characteristic diagram relating the length of the n-type surface drain regions and the on-resistance Ron of the experimental n-channel vertical MOSFETs with each other.

FIGS. 8–9 illustrate the relation between the length of the surface drain region and the input capacitance Ciss, which affects the switching time. FIGS. 10 and 11 illustrate the relation between the length of the surface drain region and the on-resistance Ron. In FIGS. 8 and 9, the horizontal axis represents the length of the surface drain region, and the vertical axis the input capacitance Ciss. In FIGS. 10 and 11, the horizontal axis represents the length of the surface drain region, and the vertical axis the on-resistance Ron. The width of the surface drain region is 1.6 µm, and the surface area ratio of the surface drain regions is 0.12.

Referring now to FIG. 8, the input capacitance Ciss is almost constant in the range, where the length of the surface drain region is 500 µm or longer. The input capacitance Ciss increases gradually as the length of the surface drain region decreases below 500 µm. FIG. 9 shows an expansion of part of FIG. 8 where the length of the surface drain region is 400 µm or shorter. Referring now to FIG. 9, the input capacitance Ciss increases sharply as the length of the surface drain region decreases below 100 µm. FIGS. 8 and 9 indicate that the n$^-$-type surface drain region is preferably 100 µm or longer in length, and more preferably 500 µm or longer in length, to shorten the switching time.

Referring now to FIG. 10, the on-resistance is almost constant in the range, where the length of the surface drain region is 500 µm or longer. The on-resistance increases gradually as the length of the surface drain region decreases below 500 µm. FIG. 11 shows an expansion of part of FIG. 10 where the length of the surface drain region is 400 µm or shorter. Referring now to FIG. 11, the on-resistance increases sharply as the length of the surface drain region decreases below 100 µm. FIGS. 10 and 11 indicate that the n$^-$-type surface drain region be 100 µm or longer in length, and especially 500 µm or longer, to reduce the on-resistance. By limiting the length of the surface drain region to 500 µm or longer, a semiconductor device having low on-resistance and switching loss is obtained.

The gate electrode can be formed of a plurality of stripes. By forming the well region using the gate electrode formed of a plurality of stripes as a mask, stripe-shaped surface drain regions surrounded by the well region are inevitably formed under the gate electrode stripes. As described earlier, it is desirable to set the width of the surface drain region to within the range of 0.1 µm and 2 µm. The width of the surface drain region is determined by the stripe width of the gate electrode used as a mask for forming the well region and the lateral diffusion length of the impurity for forming the well region. The width of the gate electrode stripes for confining the stripe width of the surface drain regions within the appropriate range described above is from 4 µm to 8 µm, and preferably from 5 µm to 7 µm, assuming that the lateral diffusion length of the impurity is a little bit less than 2 µm.

Since the length of the surface drain regions is determined by the length of the gate electrode stripes due to the same reason, the length of the gate electrode stripes is 100 µm or longer, and preferably 500 µm or longer, which is the appropriate length of the surface drain regions. Moreover, narrow bridges connecting the gate electrode stripes facilitate to reduce the gate resistance. The bridges of the gate electrode are less than 4 µm in width. If the bridges of the gate electrode are less than 4 µm in width and if the lateral diffusion length of the impurity is adjusted at about 2 µm, the well region will extend below the bridges by the diffusion from both sides of the bridges such that the well region will surround the surface drain regions. Preferably, one or less bridge is formed along every 50 µm in length, more preferably along every 250 µm, of the stripe of the gate electrode.

Although the gate resistance becomes low by arranging many bridges, the switching speed becomes slow and the switching loss increases, since the capacitance Cgd between the gate and drain increases. Although the well region will extend below the bridges by the diffusion from both sides of the bridges, the source region formed in the surface portion of the well region will not extend below the bridges, since the lateral diffusion length of the source region is short due to the shallow diffusion depth of the source region. Since channels are hardly created below the bridges, the regions below the bridges remain as ineffective regions, and the channel width for the same area is narrow, causing high on-resistance. Thus, it is not advantageous to thoughtlessly increase the bridges. In conclusion, it is advantageous to dispose one or less bridge along every 100 µm, more preferably along every 500 µm in length of the stripe of the gate electrode.

Advantageously, the resistivity in the portions of the surface drain regions shallower than the well region is lower than the resistivity in the main portion of the breakdown-voltage sustaining layer below the well region. This configuration is effective to obtain low on-resistance.

Guard rings can also be used in the breakdown withstanding structure for raising the breakdown voltage of the device. The guard rings of the second conductivity type can be formed in the surface portion of the semiconductor chip so that the guard rings surround the well region. The number of the guard rings can be set equal to or greater than the number n calculated by the following expressions: n=1.0×Vbr/100, n=1.5×Vbr/100, or n=6.0×Vbr/100, where Vbr (V) is the breakdown voltage of the semiconductor device.

Figure 14:
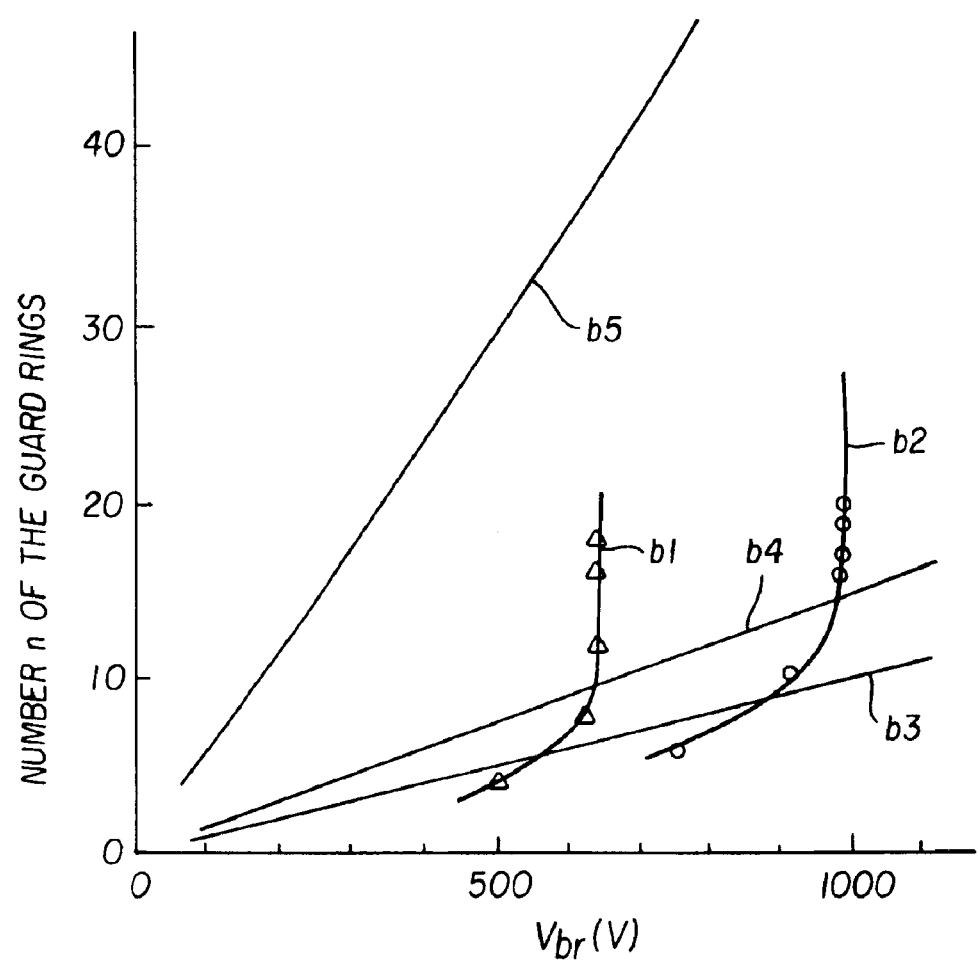
FIG. 14 is a characteristic diagram relating the number n of the guard rings with the breakdown voltage Vbr.

FIG. 14 is a graph relating the number n of the guard rings and the breakdown voltage Vbr (V) obtained by simulation, which changes the number n of the guard rings and by examining the experimental devices, the number n of the guard rings thereof being different from device to device. The horizontal axis represents the breakdown voltage Vbr (V), and the vertical axis the number n of the guard rings.

The properties of the experimental n$^-$-type drift layer, represented by the parameters of the Si wafer doped with phosphorus ions, are as follows: the specific resistance ρ=18 Ωcm and the thickness of the Si wafer t=48.5 µm (the curve b1), and the specific resistance ρ=32.5 Ωcm and the thickness of the Si wafer t=76.5 µm (the curve b2). In each wafer, the breakdown voltage Vbr (V) increases with increasing number of the guard rings. However, all the breakdown voltages saturate at the value from 97 to 98% of the theoretical breakdown voltages (654 V and 1011 V, respectively) calculated for the flat junction based on the properties of Si in the n$^-$-type drift layer. The breakdown voltage does not increase from the value from 97 to 98% of the theoretical breakdown voltages, even if the number of the guard rings is further increased. For the number of the guard rings, the equation n=1.0×Vbr/100 (the curve b3) is defined as a boundary at which the region in which the breakdown voltage is improved greatly ceases. The equation n=1.5×Vbr/100 (the curve b4) defines the number of the guard rings, beyond which the breakdown voltage is not improved by further increasing the number of the guard rings.

Since the conventional breakdown withstanding structure provides a breakdown voltage as high as 90% of the theoretical value based on the above described properties of Si, a higher breakdown voltage is expected by increasing the number of the guard rings beyond the value calculated by the equations described above. On the other hand, the upper limit number of the guard rings is defined by n=6.0×Vbr/100.

Since the breakdown withstanding structure is widened by increasing the number of the guard rings, the chip size of the practical device is enlarged. Since the breakdown voltage saturates as shown in FIG. 14 even when the number of the guard rings is increased, it is practical to set the upper limit number of the guard rings. Considering the withstanding capability against charge accumulation on the surface of the breakdown withstanding structure assumed in conducting endurance tests of the device, to which the present invention can be applied, it is preferable to set the upper limit six times as many as the number of the guard rings, at which the effects of the present invention become remarkable. In short, the upper limit number of the guard rings can be defined by the equation n=6.0×Vbr/100. By arranging the guard rings, the number of which is less than the number n calculated from the equation n=6.0×Vbr/100, a high breakdown voltage is obtained while preventing charge accumulation on the device surface and the chip size from enlarging.

The spacing between the well region of the second conductivity and the first guard ring of the second conductivity nearest to the well region is 1 $\mu$m or narrower, and preferably 0.5 $\mu$m or narrower.

Figure 15:
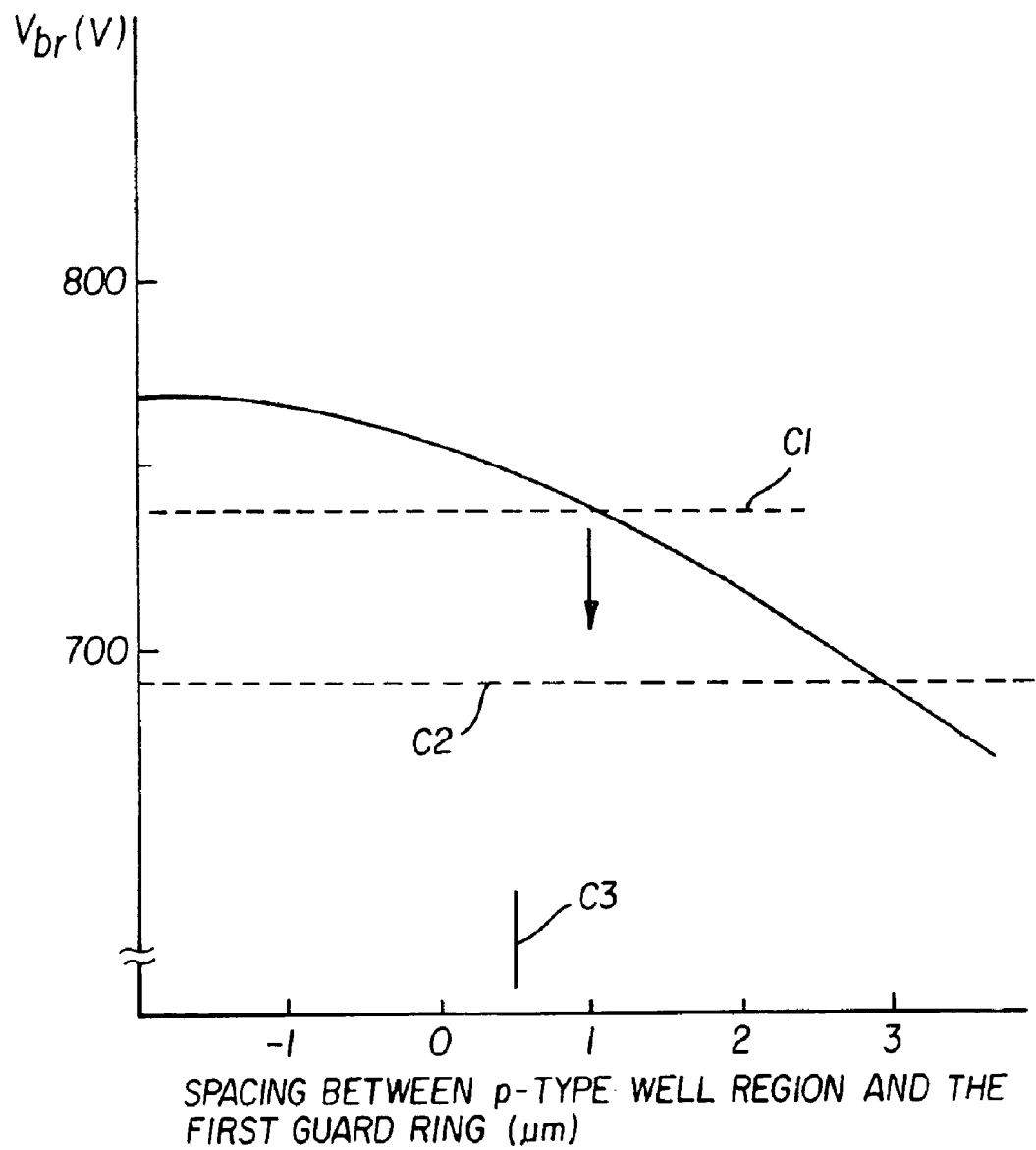
FIG. 15 is a graph relating the breakdown voltage Vbr with the spacing between the p-type well and the first guard ring.

FIG. 15 illustrates the relations between the breakdown voltage and the spacing between the well region and the first guard ring obtained by simulation and by examining experimental devices. The horizontal axis represents the spacing ($\mu$m), and the vertical axis the breakdown voltage Vbr (V). The properties of Si for the n$^-$-type drift layer includes the specific resistance $\rho$=22.5 $\Omega$cm and the thickness of the Si wafer t=57.0 $\mu$m. The junction depth of the p-type well region and the junction depth of the guard ring are 3.5 $\mu$m.

As the p-type well region and the first guard ring is spaced apart more widely, the breakdown voltage decreases montonically. At the spacing of 3 $\mu$m, the breakdown voltage is the same with the breakdown voltage (the curve c2) obtained by the combination of the n$^-$-type drift layer and the conventional breakdown withstanding structure. As FIG. 15 indicates, about 95% or more of the breakdown voltage (the curve c1) of the n$^-$-type drift layer is obtained. That is, the breakdown voltage is improved by 5% from the breakdown voltage of the conventional structure (the curve c2). By setting the spacing between the well region and the first guard ring at 0.5 $\mu$m or narrower, the breakdown voltage can be improved by 7.5% from the breakdown voltage of the conventional structure.

It is well known that the on-resistance and the breakdown voltage are related with each other by Ron$\propto$Vbr$^{2.5}$. By setting the spacing between the well region and the first guard ring at 0.5 $\mu$m or narrower, the on-resistance is reduced by 20%, which is a substantial leap. In addition, when the well region and the first guard ring are connected with each other in the surface portion of the semiconductor chip, the electric field strength relaxation is effected maximally if the connection portion in the surface portion is depleted, resulting in the highest breakdown voltage.

In FIG. 15, the breakdown voltage rises from the spacing of 0 $\mu$m, at which the well region and the first guard ring are in contact with each other, to the negative spacing region, in which the well region and the first guard ring overlap each other, and saturates at around −1 $\mu$m. The reason is as follows. The breakdown voltage lowers as the spacing between the well region and the first guard ring becomes wider, since the electric field strength is intensified more due to the curvature of the pn-junction of the well region. The electric field strength is relaxed more as the spacing between the well region and the guard ring becomes narrower, since the curvature of the pn-junction becomes less influential. And, the curvature of the pn-junction is not influential when the well region and the first guard ring overlap each other for about 1 $\mu$m. The spacing between the first guard ring nearest to the well region and the second guard ring second nearest to the well region is 1.5 $\mu$m or narrower, preferably 1 $\mu$m or narrower, and more preferably 0.5 $\mu$m or narrower.

Figure 16:
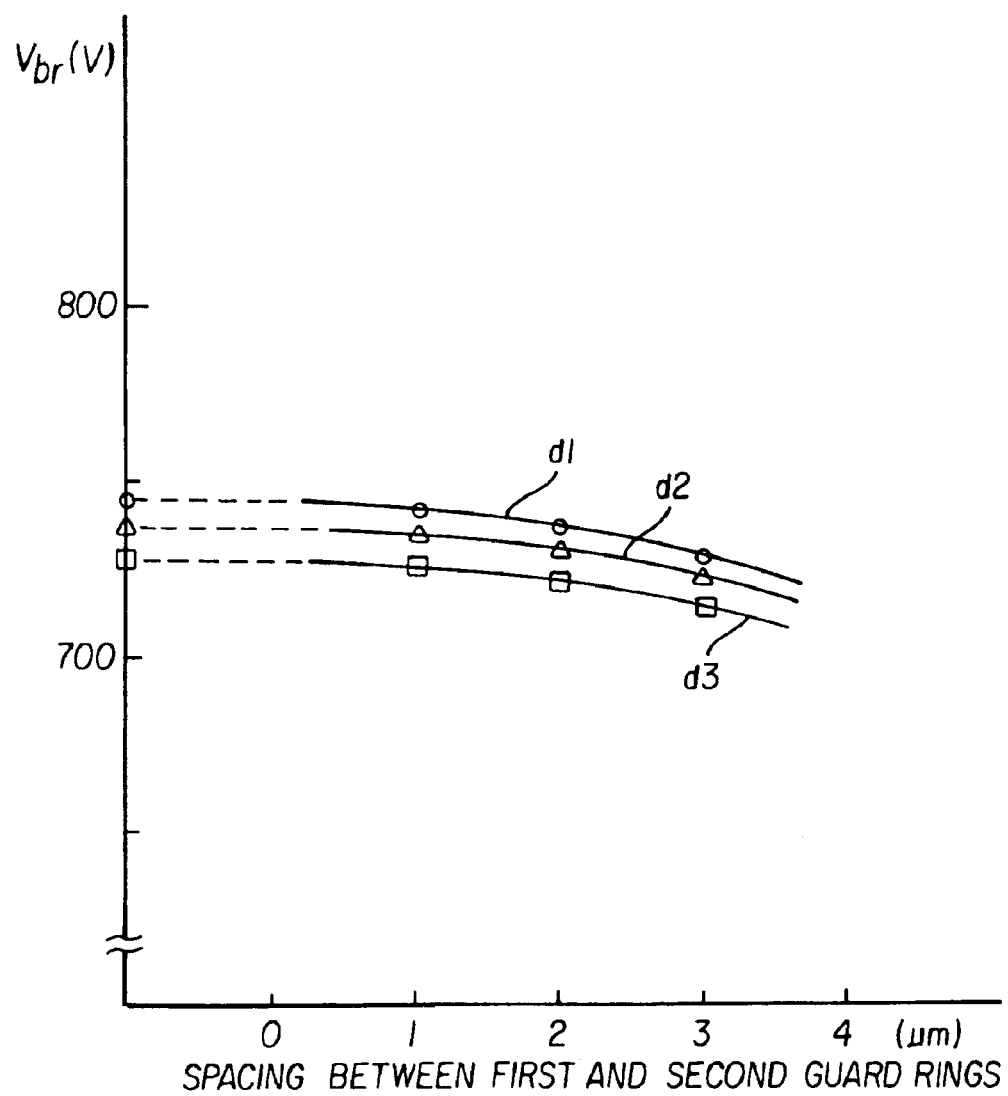
FIG. 16 is a graph relating the breakdown voltage Vbr with the spacing between the first and second guard rings.

FIG. 16 illustrates the relations between the breakdown voltage and the spacing between the first guard ring and the second guard ring obtained by simulation and by examining experimental devices. The horizontal axis represents the spacing ($\mu$m) between the first and second guard rings, and the vertical axis the breakdown voltage Vbr (V).

In FIG. 16, the curve d1 represents the results for the spacing between the p-type well region and the first guard ring of 0.5 $\mu$m, the curve d2 for the spacing of 1.0 $\mu$m, and the curve d3 for the spacing of 1.5 $\mu$m. The important item is that the spacing between the first and second guard rings and so on be set so as not to impair the breakdown voltage already set by the spacing between the well region and the first guard ring. Around 98% or more of the breakdown voltage already set by the relation between the p-type well region and the first guard ring is retained by setting the spacing between the first and second guard rings at 1.5 $\mu$m or narrower. Around 99% or more of the breakdown voltage already set by the relation between the p-type well region and the first guard ring is retained by setting the spacing between the first and second guard rings at 1.0 $\mu$m or narrower. And, a breakdown withstanding structure, which retains around 99.5% or more of the breakdown voltage already set by the relation between the p-type well region and the first guard ring, is obtained by setting the spacing between the first and second guard rings at 0.5 $\mu$m or narrower.

Due to the same reason described above, the electric field strength of the pn-junction between the well region and the breakdown-voltage sustaining layer is relaxed more as the spacing between the first and second guard rings becomes narrower, and a higher breakdown voltage is realized. Furthermore, the spacing between the second guard ring and the third guard ring third nearest to the well region is set at 2.0 $\mu$m or narrower, and preferably at 1.0 $\mu$m or narrower.

Table 3 below sets forth the relations between the breakdown voltage Vbr (V) and the spacing ($\mu$m) between the second and third guard rings obtained by simulation and by examining experimental devices, with the spacing between the well region and the first guard ring as a parameter. The spacing between the first and second guard rings is set at 1.0 $\mu$m.

TABLE 3

Breakdown voltage and spacing between the second and third guard rings

| Spacing $I_1$ between well region and first guard ring | Spacing $I_2$ between first and second guard rings | Spacing $I_3$ between second and third guard rings | Breakdown voltages Vbr (V) | Ratio to the combination of $I_1$ and $I_2$ (%) |
|---|---|---|---|---|
| 0.5 $\mu$m | 1.0 $\mu$m | 1.0 $\mu$m | 738 | 99.6 |
| 0.5 $\mu$m | 1.0 $\mu$m | 2.0 $\mu$m | 737 | 99.4 |
| 1.0 $\mu$m | 1.0 $\mu$m | 1.0 $\mu$m | 732 | 99.6 |
| 1.0 $\mu$m | 1.0 $\mu$m | 2.0 $\mu$m | 730 | 99.3 |

More than 99% of the breakdown voltage determined by the spacing between the well region and the first guard ring and the spacing between the first and second guard rings is retained by setting the spacing between the second and third guard rings at 2.0 $\mu$m or narrower. More than 99.5% of the breakdown voltage determined by the spacing between the well region and the first guard ring and the spacing between the first and second guard rings is retained by setting the spacing between the second and third guard rings at 1.0 $\mu$m or narrower. In the same way as described earlier, the electric field strength of the junction portion is relaxed, and a high breakdown voltage is obtained.

The spacing between the third guard ring and the fourth guard ring fourth nearest to the well region is 2.5 μm or narrower, and preferably 2.0 μm or narrower. In the same way as described above, the electric field strength of the junction portion is relaxed, and a high breakdown voltage is obtained. The spacing between the well region and the first guard ring nearest to the well region is set at $d_1/4$ or narrower, and preferably at $d_1/8$ or narrower, where $d_1$ is shallower one of the junction depth of the well region and the junction depth of the guard rings.

The spacing between the well region and the first guard ring nearest to the well region is defined as described above from another view point based on the junction depth of the well region or the junction depth of the guard rings. The spacing between the first guard ring and the second guard ring is $d_2/4$ or narrower, and preferably $d_2/8$ or narrower, where $d_2$ is the junction depth of the guard rings. Furthermore, the spacing between the second guard ring and the third guard ring is $d_2/4$ or narrower, and preferably $d_2/8$ or narrower. The spacing between the first and second guard rings or the spacing between the second and third guard rings is defined as described above from still another view point based on the junction depth of the guard rings. In the same way as described above, the electric field strength of the junction portion is relaxed, and a high breakdown voltage is obtained.

The difference $I_2-I_1$ between the spacing $I_2$ between the first and second guard rings and the spacing $I_1$ between the well region and the first guard ring is set at 1 μm or narrower. The difference $I_3-I_2$ between the spacing $I_3$ between the second guard ring and the third guard ring third nearest to the well region and the spacing $I_2$ between the first and second guard rings is 1 μm or narrower. And, the difference $I_4-I_3$ between the spacing $I_4$ between the third and fourth guard rings and the spacing $I_3$ between the second and third guard rings is 1 μm or narrower.

The relations between the spacings of the adjacent pairs of the guard rings are defined as described above based on a different view point. When the spacings of the adjacent pairs of the guard rings are too different from each other, electric field strength is intensified in the wider spacing, causing a breakdown. For avoiding a breakdown, it is preferable to set the spacing between the adjacent guard rings at 1 μm or narrower at least up to the fourth guard ring. The spacing differences $I_2-I_1$, $I_3-I_2$, and $I_4-I_3$ set at 0.5 μm or narrower are effective so a lower the breakdown voltage. However, it is preferable that the spacing differences be 0.2 μm or wider, since the too narrow spacing between the guard rings reduces the potential difference between the adjacent guard rings and the size effect is impaired. Therefore, the optimum spacing difference is around 0.5 μm, that is from 0.2 to 0.8 μm.

When many guard rings are disposed, the widths of the guard rings are set such that the first guard ring is wider than the fifth guard ring, the second guard ring is wider than the sixth guard ring, and the third guard ring is wider than the seventh guard ring. By setting the widths of the guard rings as described above, the electric field strength of the inner guard ring, which is higher than the electric field of the outer guard ring, is relaxed.

An electrical conductor film can be arranged above the surface of the breakdown-voltage sustaining layer between the first guard ring and the well region with an insulation film interposed between the electrical conductor film and the surface of the breakdown-voltage sustaining layer. Since the electrical conductor film arranged as described above prevents the charges on the surface of the breakdown withstanding structure from affecting the semiconductor chip surface, the breakdown voltage can be stabilized.

The electrical conductor film can be at a floating potential. Since the effect of the electrical conductor film does not change whether the potential thereof is floated or fixed, it is not always necessary to connect the electrical conductor film to a similar adjacent electrical conductor film. In the similar way as described above, electrical conductor films can be arranged above the surface of the breakdown-voltage sustaining layer between the first and second guard rings, above the surface of the breakdown-voltage sustaining layer between the second and third guard rings, and above the surface of the breakdown-voltage sustaining layer between the third and fourth guard rings, with an insulation film interposed between the electrical conductor films and the surface of the breakdown-voltage sustaining layer. The electrical conductor films arranged as described above exhibit the same effect.

The semiconductor device can further include an organic polymer film protecting the surface of the semiconductor device. The resistivity in the portions of the surface drain regions shallower than the well region is lower than the resistivity in the main portion of the breakdown-voltage sustaining layer below the well region.

The setting described above is effective, in the same way as the foregoing counter doping, to reduce the JFET resistance in the surface drain regions surrounded by the well region. Since the area ratio of the surface drain regions is set smaller than the conventional area ratio, the JFET resistance tends to become higher. Therefore, the counter doping is also effective.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP PA 2001-176499, in its entirety, including the drawings, claims, and the specification thereof, is incorporated herein by reference.

What is claimed is:

1. A semiconductor device comprising:
   a semiconductor chip;
   a low electrical resistance layer of a first conductivity type or a second conductivity type on a bottom portion of the semiconductor chip;
   a breakdown-voltage sustaining layer of the first conductivity type above the low electrical resistance layer;
   a well region of the second conductivity type in a surface portion of the breakdown-voltage sustaining layer;
   a source region of the first conductivity type in a surface portion of the well region, the source region being spaced apart from the breakdown-voltage sustaining layer by the well region;
   a gate electrode above a portion extending from the well region and adjoining the source region, with a gate insulation film interposed therebetween; and
   surface drain regions of the first conductivity type surrounded by the well region in the surface of the semiconductor chip,
   wherein the ratio between the total surface area of the surface drain regions surrounded by the well region and the surface area of the well region, including the source region, is from 0.01 to 0.2.

2. The semiconductor device according to claim 1, wherein the resistivity ρ (Ωcm) of a main portion of the breakdown-voltage sustaining layer below the well region is within a range expressed by −5.43+0.0316 Vbr<ρ<−8.60+ 0.0509 Vbr, where Vbr is the breakdown voltage.

3. The semiconductor device according to claim 1, wherein the resistivity ρ (Ωcm) of a main portion of the breakdown-voltage sustaining layer below the well region is within a range expressed by −5.43+0.0316 Vbr<ρ<−7.71+ 0.0456 Vbr, where Vbr is the breakdown voltage.

4. The semiconductor device according to claim 1, wherein the thickness t (μm) of a portion of the breakdown-voltage sustaining layer between the well region and the low electrical resistance layer is within a range expressed by 1.26+0.0589 Vbr<t<1.96+0.0916 Vbr, where Vbr is the breakdown voltage.

5. The semiconductor device according to claim 1, wherein the surface drain regions in the surface of the semiconductor chip are stripe shaped.

6. The semiconductor device according to claim 5, wherein the length of the stripe of the surface drain region is 100 μm or longer.

7. The semiconductor device according to claim 5, wherein the stripe of each of the surface drain regions includes a plurality of convex portion extending from the stripe in the direction different from the lengthwise direction of the stripe of the surface drain region.

8. The semiconductor device according to claim 5, wherein the resistivity in portions of the surface drain regions shallower than the well region is lower than the resistivity in the main portion of the breakdown-voltage sustaining layer below the well region.

9. The semiconductor device according to claim 1, wherein the surface drain regions in the surface of the semiconductor chip are stripe shaped, and a main portion of the stripe of each of the surface drain regions is from 0.1 to 2 μm in width.

10. The semiconductor device according to claim 9, wherein the length of the stripe of the surface drain region is 100 μm or longer.

11. The semiconductor device according to claim 10, wherein the length of the stripe of the surface drain region is 500 μm or longer.

12. The semiconductor device according to claim 1, wherein the gate electrode comprises a plurality of stripes extending parallel with each other.

13. The semiconductor device according to claim 12, wherein the stripes of the gate electrode are surrounded by the well region.

14. The semiconductor device according to claim 12, wherein each of the stripes of the gate electrode covers one or more surface drain regions.

15. The semiconductor device according to claim 12, wherein a main portion of each of the stripes of the gate electrode is from 4 to 8 μm in width.

16. The semiconductor device according to claim 12, wherein the length of each of the stripes of the gate electrode is 100 μm or longer.

17. The semiconductor device according to claim 12, wherein the gate electrode comprises narrow bridges connecting the stripes thereof.

18. The semiconductor device according to claim 12, wherein the resistivity in portions of the surface drain regions shallower than the well region is lower than the resistivity in the main portion of the breakdown-voltage sustaining layer below the well region.

19. The semiconductor device according to claim 1, wherein the resistivity in portions of the surface drain regions shallower than the well region is lower than the resistivity in the main portion of the breakdown-voltage sustaining layer below the well region.

20. The semiconductor device according to claim 1, further comprising:
   guard rings of the second conductivity type in the surface portion of the semiconductor chip, the guard rings surrounding the well region,
   wherein the spacing between the well region and a first of the guard rings, which is nearest to the well region, is 1 μm or less.

21. The semiconductor device according to claim 20, wherein the spacing between the well region and the first guard ring is 0.5 μm or less.

22. The semiconductor device according to claim 21, wherein the first guard ring is in contact with the well region.

23. The semiconductor device according to claims 20, wherein the spacing between the first guard ring and a second of the guard rings, which is second nearest to the well region, is 1.5 μm or less.

24. The semiconductor device according to claim 20, wherein the difference $I_2-I_1$ between the spacing $I_2$ between the first guard ring and a second of the guard rings, which is second nearest to the well region, and the spacing $I_1$ between the well region and the first guard ring is 1 μm or less.

25. The semiconductor device according to claim 20, wherein the number of the guard rings is 5 or more, and the width of the first guard ring is wider than the width of a fifth of the guard rings, which is fifth nearest to the well region.

26. The semiconductor device according to claim 20, further comprising an electrical conductor film above the surface of the breakdown-voltage sustaining layer between the well region and the first guard ring, with an insulation film interposed between the electrical conductor film and the surface of the breakdown-voltage sustaining layer.

27. The semiconductor device according to claim 20, wherein the breakdown-voltage sustaining layer comprises a semiconductor region of the first conductivity type.

28. The semiconductor device according to claim 20, wherein the breakdown-voltage sustaining layer comprises semiconductor regions of the first conductivity type and semiconductor regions of the second conductivity type arranged alternately.

29. The semiconductor device according to claim 1, further comprising:
   guard rings of the second conductivity type in the surface portion of the semiconductor chip, the guard rings surroundings the well region,
   wherein the spacing between the well region and a first of the guard rings, which is nearest to the well region being $d_1/4$ or less, $d_1$ being shallower one of the junction depth of the well region and the junction depth of the guard rings.

30. The semiconductor device according to claim 29, wherein the spacing between the well region and the first guard ring is $d_1/8$ or less.

31. The semiconductor device according to claims 29, wherein the spacing between the first guard ring and a second guard ring, which is second nearest to the well region, is $d_2/4$ or less, where $d_2$ is the junction depth of the guard rings.

32. The semiconductor device according to claim 29, wherein the difference $I_2-I_1$ between the spacing $I_2$ between the first guard ring and a second of the guard rings, which is second nearest to the well region, and the spacing $I_1$ between the well region and the first guard ring is 1 µm or less.

33. The semiconductor device according to claim 29, wherein the number of the guard rings is 5 or more, and the width of the first guard ring is wider than the width of a fifth of the guard rings, which is fifth nearest to the well region.

34. The semiconductor device according to claim 29, further comprising an electrical conductor film above the surface of the breakdown-voltage sustaining layer between the well region and the first guard ring, with an insulation film interposed between the electrical conductor film and the surface of the breakdown-voltage sustaining layer.

35. The semiconductor device according to claim 29, wherein the breakdown-voltage sustaining layer comprises a semiconductor region of the first conductivity type.

36. The semiconductor device according to claim 29, wherein the breakdown-voltage sustaining layer comprises semiconductor regions of the first conductivity type and semiconductor regions of the second conductivity type arranged alternately.

37. The semiconductor device according to claim 1, further comprising an organic polymer film protecting the surface of the semiconductor device.

38. The semiconductor device according to claim 1, wherein a breakdown voltage of the semiconductor device is higher than 100 V and lower than 5000 V.

39. A semiconductor device comprising:
a semiconductor chip;
a low electrical resistance layer of a first conductivity type or a second conductivity type on a bottom portion of the semiconductor chip;
a breakdown-voltage sustaining layer of the first conductivity type above the low electrical resistance layer;
a well region of the second conductivity type in a surface portion of the breakdown-voltage sustaining layer; and
guard rings of the second conductivity type in the surface portion of the semiconductor chip, the guard rings surrounding the well region,
wherein the number of the guard rings being equal to or more than the number n expressed by n=1.5 or greater× Vbr/100, where Vbr is the breakdown voltage, and
wherein a first of the guard rings, which is nearest to the well region, is disposed to contact the well region.

40. The semiconductor device according to claim 39, wherein the number n is expressed by n=6.0×Vbr/100.

41. A semiconductor device comprising:
a semiconductor chip;
a low electrical resistance layer of a first conductivity type or a second conductivity type on a bottom portion of the semiconductor chip;
a breakdown-voltage sustaining layer of the first conductivity type above the low electrical resistance layer;
a well region of the second conductivity type in a surface portion of the breakdown-voltage sustaining layer; and
guard rings of the second conductivity type in the surface portion of the semiconductor chip, the guard rings surrounding the well region,
wherein the number of the guard rings being equal to or more than the number n expressed by n=1.0 or greater×Vbr/100, where Vbr is the breakdown voltage, and
wherein the spacing between the well region and a first of the guard rings, which is nearest to the well region is, 1 µm or less.

42. The semiconductor device according to claim 41, wherein the spacing between the well region and the first guard ring is 0.5 µm or less.

43. The semiconductor device according to claim 42, wherein the first guard ring is in contact with the well region.

44. The semiconductor device according to claim 41, wherein the spacing between the first guard ring and a second guard ring, which is second nearest to the well region, is 1.5 µm or less.

45. The semiconductor device according to claim 41, wherein the spacing between the well region and the first of the guard rings, which is nearest to the well region, is $d_1/4$ or less, where $d_1$ is shallower one of the junction depth of the well region and the junction depth of the guard rings.

46. The semiconductor device according to claims 41, wherein the spacing between the first guard ring and a second guard ring, which is second nearest to the well region, is $d_2/4$ or less, where $d_2$ is the junction depth of the guard rings.

47. The semiconductor device according to claim 41, wherein the difference $I_2-I_1$ between the spacing $I_2$ between the first of the guard rings, which is nearest to the well region, and a second of the guard rings, which is second nearest to the well region, and the spacing $I_1$ between the well region and the first guard ring is 1 µm or less.

48. The semiconductor device according to claim 41, wherein the number of the guard rings is 5 or more, and the width of a first of the guard rings, which is nearest to the well region, is wider than the width of a fifth of the guard rings, which is fifth nearest to the well region.

49. The semiconductor device according to claim 41, further comprising an electrical conductor film above the surface of the breakdown-voltage sustaining layer between the well region and a first of the guard rings, which is nearest to the well region, with an insulation film interposed between the electrical conductor film and the surface of the breakdown-voltage sustaining layer.

50. The semiconductor device according to claim 41, wherein the breakdown-voltage sustaining layer comprises a semiconductor region of the first conductivity type.

51. The semiconductor device according to claim 41, wherein the breakdown-voltage sustaining layer comprises semiconductor regions of the first conductivity type and semiconductor regions of the second conductivity type arranged alternately.

52. The semiconductor device according to claim 41, wherein the resistivity ρ (Ωcm) of a main portion of the breakdown-voltage sustaining layer below the well region is within a range expressed by $-5.43+0.0316$ Vbr$<\rho<-8.60+0.0509$ Vbr, where Vbr is the breakdown voltage.

53. The semiconductor device according to claim 41, wherein the thickness t (µm) of the portion of the breakdown-voltage sustaining layer between the well region and the low electrical resistance layer is within a range expressed by $1.26+0.0589$ Vbr$<t<1.96+0.0916$ Vbr, where Vbr is the breakdown voltage.

54. A semiconductor device comprising:
a semiconductor chip;
a low electrical resistance layer of a first conductivity type or a second conductivity type on a bottom portion of the semiconductor chip;
a breakdown-voltage sustaining layer of the first conductivity type above the low electrical resistance layer;
a well region of the second conductivity type in a surface portion at the breakdown-voltage sustaining layer; and
guard rings of the second conductivity type in the surface portion of the semiconductor chip, the guard rings surrounding the well region, wherein the number of the guard rings is equal to or more than the number n expressed by n=1.0 or greater×Vbr/100, where Vbr is the breakdown voltage, and wherein the resistivity ρ (Ωcm) of a main portion of the breakdown-voltage sustaining layer below the well region is within a range expressed by $-5.43+0.0316$ Vbr<ρ<$-7.71+0.0456$ Vbr, where Vbr is the breakdown voltage.

* * * * *